US012349586B2

(12) United States Patent
Ko et al.

(10) Patent No.: US 12,349,586 B2
(45) Date of Patent: Jul. 1, 2025

(54) ELECTRONIC DISPLAY DEVICE HAVING PLURALITY OF OPENINGS IN COMMON ELECTRODE OVERLAPPING TRANSMISSION PORTIONS OF BLOCKING PATTERN, AND METHOD FOR MANUFACTURING THE SAME

(71) Applicant: Samsung Display Co., Ltd., Yongin-si (KR)

(72) Inventors: Moosoon Ko, Seoul (KR); Yong-Je Jeon, Yongin-si (KR); Sewan Son, Yongin-si (KR); Jingoo Jung, Seongnam-si (KR); Kyung Hyun Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 711 days.

(21) Appl. No.: 17/379,429

(22) Filed: Jul. 19, 2021

(65) Prior Publication Data

US 2022/0028949 A1 Jan. 27, 2022

(30) Foreign Application Priority Data

Jul. 21, 2020 (KR) ........................ 10-2020-0090310

(51) Int. Cl.
H10K 71/00 (2023.01)
H10D 86/40 (2025.01)
(Continued)

(52) U.S. Cl.
CPC ......... *H10K 71/621* (2023.02); *H10K 50/822* (2023.02); *H10K 59/1213* (2023.02);
(Continued)

(58) Field of Classification Search
CPC ............ H10K 50/822; H10K 59/1201; H10K 59/1213; H10K 59/124; H10K 59/126; H10K 59/131; H10K 71/00; H10K 71/621
(Continued)

(56) References Cited

U.S. PATENT DOCUMENTS 7,820,466 B2 10/2010 Jo et al.
8,835,926 B2 9/2014 Yoon et al.
(Continued)

FOREIGN PATENT DOCUMENTS

CN 110021625 A 7/2019
CN 110021640 A 7/2019
(Continued)

OTHER PUBLICATIONS

Karnakis, Dimitris, et al., "Mechanistic aspects of selective laser patterning of multilayered thin-film structures in OLEO fabrication," Proceedings of LOPE-C 2010, Organic Electronics Association (OE-A), 2010, 6 pages.

*Primary Examiner* — Matthew E. Gordon
(74) *Attorney, Agent, or Firm* — Womble Bond Dickinson (US) LLP

(57) ABSTRACT

An electronic device includes: a display panel including a display region including a first display region and a second display region having a higher transmittance than the first display region and an electronic module below the second display region of the display panel, wherein the display panel includes: a base layer; a plurality of first pixel electrodes on the base layer and in the first display region; a plurality of second pixel electrodes on the base layer and in the second display region; a common electrode on the plurality of first pixel electrodes and the plurality of second pixel electrodes and in which a plurality of openings are defined; and a blocking pattern spaced apart from the (Continued)

common electrode with the plurality of second pixel electrodes interposed therebetween and having a plurality of transmission portions overlapping the plurality of openings.

16 Claims, 24 Drawing Sheets

(51) Int. Cl.
*H10D 86/60* (2025.01)
*H10K 50/822* (2023.01)
*H10K 59/12* (2023.01)
*H10K 59/121* (2023.01)
*H10K 59/124* (2023.01)
*H10K 59/126* (2023.01)
*H10K 59/131* (2023.01)
*H10K 59/80* (2023.01)
*H10K 71/40* (2023.01)

(52) U.S. Cl.
CPC ......... *H10K 59/124* (2023.02); *H10K 59/126* (2023.02); *H10K 59/131* (2023.02); *H10K 59/80521* (2023.02); *H10K 71/00* (2023.02); *H10D 86/40* (2025.01); *H10D 86/60* (2025.01); *H10K 59/1201* (2023.02); *H10K 71/421* (2023.02)

(58) Field of Classification Search
USPC .......................................................... 257/40
See application file for complete search history.

(56) References Cited

U.S. PATENT DOCUMENTS

| | | | |
|---|---|---|---|
| 9,257,563 | B2 | 2/2016 | Ahn et al. |
| 10,135,010 | B2 | 11/2018 | Kim et al. |
| 10,978,666 | B2 | 4/2021 | Park |
| 2005/0012094 | A1 | 1/2005 | Park |
| 2016/0126494 | A1* | 5/2016 | Jung .................. H10K 59/8791 438/23 |
| 2017/0084635 | A1* | 3/2017 | Jung .................. H01L 27/1266 |
| 2017/0104048 | A1* | 4/2017 | Chung .............. H10K 59/1213 |
| 2019/0214601 | A1* | 7/2019 | Park ...................... H10K 50/11 |
| 2019/0237533 | A1* | 8/2019 | Kim .................. H01L 27/0292 |

FOREIGN PATENT DOCUMENTS

| | | |
|---|---|---|
| JP | 2008-166029 A | 7/2008 |
| JP | 5106823 B2 | 12/2012 |
| KR | 10-0497624 B1 | 7/2005 |
| KR | 10-2008-0009794 A | 1/2008 |
| KR | 10-1223722 B1 | 1/2013 |
| KR | 10-2015-0134953 A | 12/2015 |
| KR | 10-2017-0045459 A | 4/2017 |
| KR | 10-2019-0104289 A | 9/2019 |
| KR | 10-2020-0013819 A | 2/2020 |
| KR | 10-2021-0149964 A | 12/2021 |

* cited by examiner

ELECTRONIC DISPLAY DEVICE HAVING PLURALITY OF OPENINGS IN COMMON ELECTRODE OVERLAPPING TRANSMISSION PORTIONS OF BLOCKING PATTERN, AND METHOD FOR MANUFACTURING THE SAME

CROSS-REFERENCE TO RELATED APPLICATION

The present application claims priority to and the benefit of Korean Patent Application No. 10-2020-0090310, filed on Jul. 21, 2020, in the Korean Intellectual Property Office, the entire content of which is hereby incorporated by reference.

BACKGROUND

1. Field

Aspects of some embodiments of the present disclosure herein relate to an electronic device and a method for manufacturing the same.

2. Description of Related Art

An electronic device may be a device having various electronic components such as a display panel and an electronic module. The electronic module may include a camera, an infrared sensing sensor, a proximity sensor, or the like. The electronic module may be located below the display panel. The transmittance of some regions of the display panel may be higher than the transmittance of the other regions of the display panel. The electronic module may receive an external input through some regions of the display panel, or may provide an output through some regions of the display panel.

The above information disclosed in this Background section is only for enhancement of understanding of the background and therefore the information discussed in this Background section does not necessarily constitute prior art.

SUMMARY

Aspects of some embodiments of the present disclosure herein relate to an electronic device and a method for manufacturing the same. According to some embodiments, the electronic device may have a display panel with relatively improved transmittance of some regions.

Aspects of some embodiments of the present disclosure include an electronic device having a display panel with improved transmittance of some regions.

Aspects of some embodiments of the present disclosure also include a method for manufacturing an electronic device having a display panel with relatively improved transmittance of some regions.

According to some embodiments of the inventive concept, an electronic device includes: a display panel in which a display region including a first display region and a second display region having a higher transmittance than the first display region, and an electronic module below the second display region of the display panel. According to some embodiments, the display panel may include a base layer, a plurality of first pixel electrodes on the base layer and in the first display region, a plurality of second pixel electrodes on the base layer and in the second display region, a common electrode on the plurality of first pixel electrodes and the plurality of second pixel electrodes and in which a plurality of openings are defined, and a blocking pattern spaced apart from the common electrode having the plurality of second pixel electrodes interposed therebetween and in which a plurality of transmission portions overlapping the plurality of openings are defined.

According to some embodiments, the display panel may further include a plurality of first pixel circuits electrically connected to the plurality of first pixel electrodes, respectively, and a plurality of second pixel circuits electrically connected to the plurality of second pixel electrodes, respectively, wherein each of the plurality of first pixel circuits and the plurality of second pixel circuits may include a transistor including a gate, an active region, a source, and a drain, and a capacitor including a first electrode electrically connected to the transistor, and a second electrode facing the first electrode.

According to some embodiments, the blocking pattern may include a first blocking pattern and a second blocking pattern on the first blocking pattern, wherein the first blocking pattern may be on a same layer as that of the gate and includes a same material as that of the gate, and the second blocking pattern may be on a same layer as that of the second electrode, and includes a same material as that of the second electrode.

According to some embodiments, the blocking pattern may further include a third blocking pattern below the first blocking pattern.

According to some embodiments, the display panel may further include a barrier layer on the base layer and a buffer layer on the barrier layer, wherein the barrier layer may include a first sub-barrier layer on the base layer and a second sub-barrier layer on the first sub-barrier layer, and the third blocking pattern may be between the barrier layer and the buffer layer, or may be between the first sub-barrier layer and the second sub-barrier layer.

According to some embodiments, in the first blocking pattern, the second blocking pattern, and the third blocking pattern, a plurality of first transmission portions, a plurality of second transmission portions, and a plurality of third transmission portions which overlap the plurality of openings of the common electrode may be respectively defined.

According to some embodiments, the blocking pattern may be on a same layer as that of either the gate or the second electrode, and may include a same material as that of either the gate or the second electrode.

According to some embodiments, the display panel may further include a peripheral region adjacent to the display region. The plurality of first pixel circuits may be in the first display region, and the plurality of second pixel circuits may be in the peripheral region.

According to some embodiments, the display panel may further include a plurality of connection lines electrically connecting the plurality of second pixel electrodes and the plurality of second pixel electrodes, respectively, and each of the plurality of connection lines may include a transparent conductive material.

According to some embodiments, the display region may further include a third display region defined between the first display region and the second display region, and the plurality of second pixel circuits may be in the third display region.

According to some embodiments, the display panel may further include a plurality of third pixel electrodes on the base layer and in the third display region and a plurality of third pixel circuits in the third display region and electrically connected to the plurality of third pixel electrodes, respectively, wherein the number of first pixel electrodes in a first region among the plurality of first pixel electrodes may be greater than each of the number of second pixel electrodes in a second region having the same size as that of the first region among the plurality of second pixel electrodes and the number of third pixel electrodes in a third region having the same size as that of the first region among the plurality of third pixel electrodes.

According to some embodiments, the plurality of openings and the plurality of transmission portions may be defined in the second display region.

According to some embodiments, when viewed in a thickness direction of the display panel, the plurality of transmission portions and the plurality of openings may be spaced apart from the plurality of second pixel electrodes.

According to some embodiments of the inventive concept, an electronic device includes a display panel in which a display region is defined and an electronic module below the display region of the display panel, wherein the display panel includes a light emitting element including a pixel electrode in the display region, a light emitting layer on the pixel electrode, and a common electrode on the light emitting layer, a blocking pattern below the light emitting element, and when viewed in a thickness direction of the display panel, in which a transmission portion is defined in a region spaced apart from the pixel electrode, a pixel circuit spaced apart from the pixel electrode and electrically connected to the light emitting element, and a connection line electrically connecting the pixel circuit and the pixel electrode and including a transparent conductive material, wherein, when viewed in the thickness direction of the display panel, a portion of the common electrode overlapping the transmission portion may be removed.

According to some embodiments, the display panel may further include a peripheral region adjacent to the display region. The pixel circuit may be in the peripheral region.

According to some embodiments, the pixel circuit may include a transistor including a gate, an active region, a source, and a drain, and a capacitor including a first electrode electrically connected to the transistor, and a second electrode facing the first electrode, and the blocking pattern may include a first blocking pattern and a second blocking pattern on the first blocking pattern, wherein the first blocking pattern may be on a same layer as that of the gate, and may include a same material as that of the gate, and the second blocking pattern may be on a same layer as that of the second electrode, and may include a same material as that of the second electrode.

According to some embodiments of the inventive concept, a method for manufacturing an electronic device includes the steps of providing a base layer, providing a circuit layer including a blocking pattern in which a transmission portion is defined on the base layer, providing a light emitting element including a pixel electrode on the circuit layer, a light emitting layer on the pixel electrode, and a common electrode on the light emitting layer, and removing a portion of the common electrode overlapping the transmission portion by irradiating a laser in a direction toward the common electrode from the base layer.

According to some embodiments, the step of providing a circuit layer may further include providing a transistor including a gate, an active region, a source, and a drain, and providing a capacitor including a first electrode electrically connected to the transistor and a second electrode facing the first electrode, wherein the pixel electrode and the transistor may be spaced apart.

According to some embodiments, the step of providing a circuit layer including a blocking pattern may include the steps of providing a first blocking pattern and providing a second blocking pattern on the first blocking pattern, wherein the first blocking pattern may be provided in a same process as that of the gate, and the second blocking pattern may be provided in a same process as that of the second electrode.

According to some embodiments, the step of providing a circuit layer may further include a step of providing a connection line electrically connecting the transistor and the pixel electrode, wherein the connection line may include a transparent conductive material.

BRIEF DESCRIPTION OF THE DRAWINGS

The accompanying drawings are included to provide a further understanding of the inventive concept, and are incorporated in and constitute a part of this specification. The drawings illustrate aspects of some embodiments of the inventive concept and, together with the description, serve to explain principles of the inventive concept. In the drawings.

DETAILED DESCRIPTION

Figure 1:
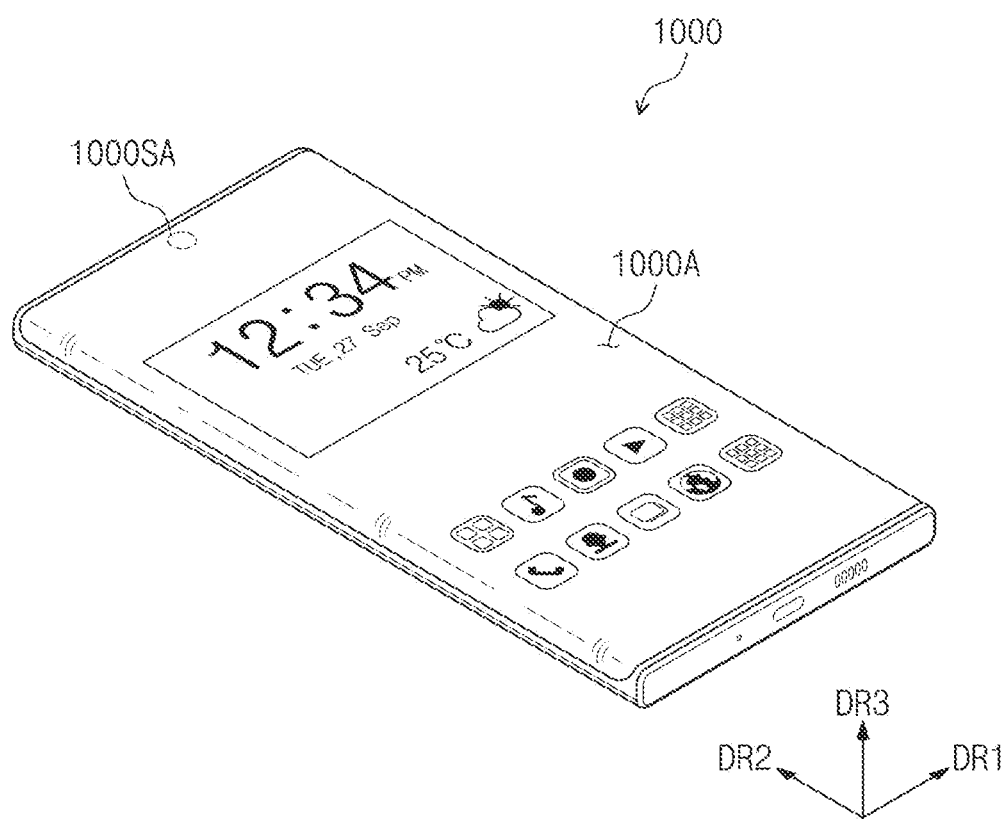
FIG. 1 is a perspective view of an electronic device according to some embodiments of the inventive concept.

In the present disclosure, when an element (or a region, a layer, a portion, etc.) is referred to as being "on," "connected to," or "coupled to" another element, it means that the element may be directly located on/connected to/coupled to the other element, or that a third element may be located therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by those skilled in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, aspects of some embodiments of the inventive concept will be described in more detail with reference to the accompanying drawings.

FIG. 1 is a perspective view of an electronic device according to some embodiments of the inventive concept.

Referring to FIG. 1, an electronic device 1000 may be a device activated according to an electrical signal. For example, the electronic device 1000 may be a mobile phone, a tablet computer, a car navigation system, a game console, or a wearable device, but the embodiments of the inventive concept are not limited thereto. In FIG. 1, the electronic device 1000 is illustrated as a mobile phone, as an example, but embodiments are not limited thereto, and the electronic device 1000 may include any other suitable electronic device.

The electronic device 1000 may display an image through a display region 1000A. The display region 1000A may include a plane (e.g., a display surface, or a primary display surface) defined by a first direction DR1 and a second direction DR2. The display region 1000A may further include curved surfaces bent from at least two sides of the plane, respectively. However, the shape of the display region 1000A is not limited thereto. For example, the display region 1000A may include only the plane, and the display region 1000A may further include four curved surfaces bent from at least two, for example, four sides of the plane, respectively.

In the display region 1000A of the electronic device 1000, a sensing region 1000SA may be defined. FIG. 1 illustrates an example of one sensing region 1000SA, but the number of the sensing region 1000SA is not limited thereto. The sensing region 1000SA may be a portion of the display region 1000A. Therefore, the electronic device 1000 may display an image through the sensing region 1000SA.

In a region overlapping the sensing region 1000SA, an electronic module, for example, a camera module, a proximity illuminance sensor, or the like may be arranged. The electronic module may receive an external input transmitted through the sensing region 1000SA, or may provide an output through the sensing region 1000SA.

The thickness direction of the electronic device 1000 may be parallel to a third direction DR3 intersecting the first direction DR1 and the second direction DR2. Therefore, a front surface (or an upper surface) and a rear surface (or a lower surface) of members constituting the electronic device 1000 may be defined on the basis of the third direction DR3.

Figure 2:
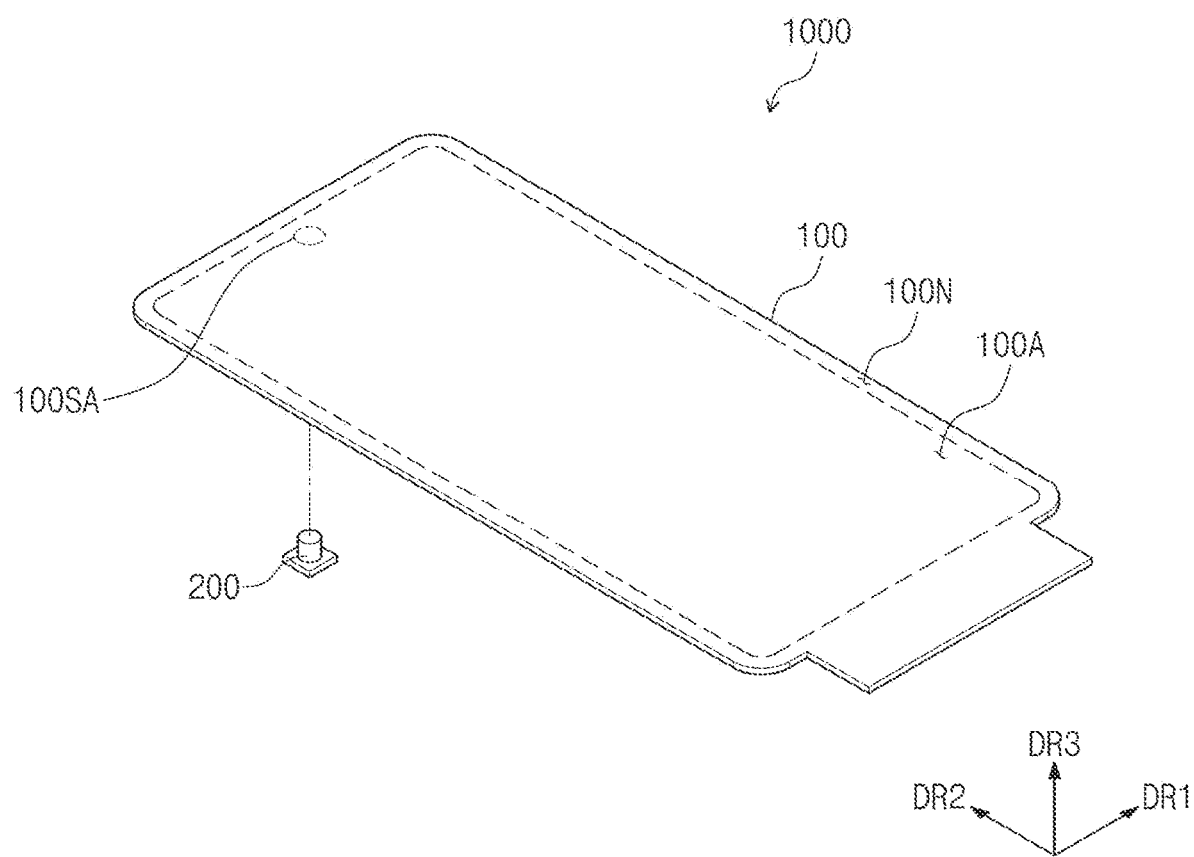
FIG. 2 is an exploded perspective view of some components of an electronic device according to some embodiments of the inventive concept.

FIG. 2 is an exploded perspective view of some components of an electronic device according to some embodiments of the inventive concept.

Referring to FIG. 2, the electronic device 1000 may include a display panel 100 and an electronic module 200. The display panel 100 may be a component configured to generate images and to sense input applied from the outside (e.g., touch input). The electronic module 200 is located below the display panel 100, and may be, for example, a camera module.

In the display panel 100, a display region 100A and a peripheral region 100N may be defined. The display region 100A may correspond to the display region 1000A illustrated in FIG. 1. Some regions of the display panel 100 may have a higher transmittance than the other regions thereof. For example, the transmittance of the sensing region 100SA of the display panel 100 may be higher than the transmittance of other portions of the display region 100A around the sensing region 100SA. The sensing region 100SA may be a portion of the display region 100A. That is, the sensing region 100SA displays an image, and may transmit an external input received by the electronic module 200 or an output from the electronic module 200.

Figure 3A:
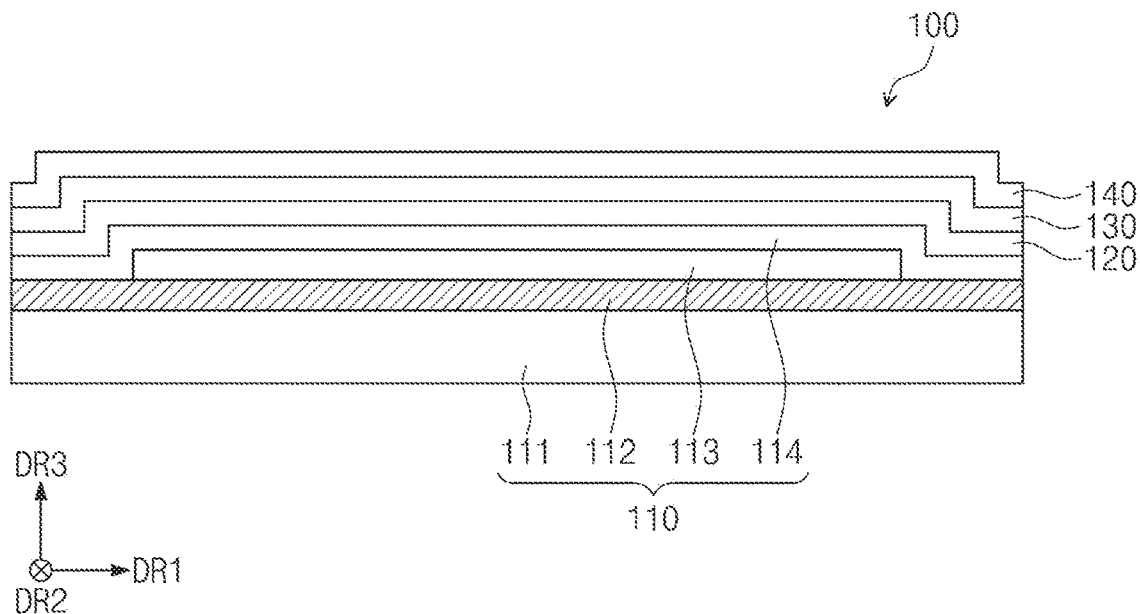
FIG. 3A is a cross-sectional view of a display panel according to some embodiments of the inventive concept.

FIG. 3A is a cross-sectional view of a display panel according to some embodiments of the inventive concept.

Referring to FIG. 3A, the display panel 100 may include a display layer 110, a sensor layer 120, an anti-reflection layer 130, and an optical layer 140.

The display layer 110 may be a component which generates images. The display layer 110 may be a light-emitting type display layer. For example, the display layer 110 may be an organic light emitting display layer, a quantum-dot display layer, or a micro-LED display layer.

The display layer 110 may include a base layer 111, a circuit layer 112, a light emitting element layer 113, and an encapsulation layer 114.

The base layer 111 may be a member which provides a base surface on which the circuit layer 112 is located. The base layer 111 may be a glass substrate, a metal substrate, or a polymer substrate. However, the embodiments of the inventive concept are not limited thereto, and the base layer 111 may be an inorganic layer, an organic layer, or a composite material layer.

The base layer 111 may have a multi-layered structure. For example, the base layer 111 may include a first synthetic resin layer, a silicon oxide(SiOx) layer located on the first synthetic resin layer, an amorphous silicon(a-Si) layer located on the silicon oxide layer, and a second synthetic resin layer located on the amorphous silicon layer. The silicon oxide layer and the amorphous silicon layer may be referred to as a base barrier layer.

Each of the first and second synthetic resin layers may include a polyimide-based resin. In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in the present disclosure, "~~"-based resin means that a functional group of "~~" is included.

The circuit layer 112 may be located on the base layer 111. The circuit layer 112 may include an insulation layer, a semiconductor pattern, a conductive pattern, a signal line, and the like. The insulation layer, a semiconductor layer, and a conductive layer are formed on the base layer 111 by coating, deposition, and the like, and thereafter, the insulation layer, the semiconductor layer, and the conductive layer may be selectively patterned through performing a photolithography process a plurality of times. Thereafter, the semiconductor pattern, the conductive pattern, and the signal line, all included in the circuit layer 112, may be formed.

The light emitting element layer 113 may be located on the circuit layer 112. The light emitting element layer 113 may include a light emitting element. For example, the light emitting element layer 113 may include an organic light emitting material, a quantum dot, a quantum rod, or a micro LED.

The encapsulation layer 114 may be located on the light emitting element layer 113. The encapsulation layer 114 may protect the light emitting element layer 113 from foreign materials such as moisture, oxygen, and dust particles.

The sensor layer 120 may be located on the display layer 110. The sensor layer 120 may sense an external input applied from the outside. The external input may be a user input. The user input includes various forms of external inputs such as a part of a user's body, light, heat, a pen, and pressure.

The sensor layer 120 may be formed on the display layer 110 through a series of processes. In this case, the sensor layer 120 may be expressed as being directly located on the display layer 110. Being directly located may mean that a third component is not located between the sensor layer 120 and the display layer 110. That is, according to some embodiments, a separate adhesive member may not be located between the sensor layer 120 and the display layer 110.

Alternatively, the sensor layer 120 and the display layer 110 may be coupled to each other by an adhesive member. The adhesive member may include a typical adhesive or a pressure-sensitive adhesive.

The anti-reflection layer 130 may be located on the sensor layer 120. The anti-reflection layer 130 may reduce the reflectance of external light incident from the outside of the display panel 100. The anti-reflection layer 130 may be formed on the sensor layer 120 through a series of processes. The anti-reflection layer 130 may include color filters. The color filters may have an arrangement (e.g., a set or predetermined arrangement). For example, the color filters may be arranged in consideration of light emitting colors of pixels included in the display layer 110. In addition, the anti-reflection layer 130 may further include a black matrix adjacent to the color filters.

The optical layer 140 may be located on the anti-reflection layer 130. The optical layer 140 may be formed on the anti-reflection layer 130 through a series of processes. The optical layer 140 may improve the front surface luminance of the display panel 100 by controlling the direction of light incident from the display layer 110. For example, the optical layer 140 may include an organic insulation layer in which openings are defined respectively corresponding to light emitting regions of the pixels included in the display layer 110, and a high refraction layer covering the organic insulation layer and filled in the openings. The high refraction layer may have a higher refractive index than a refractive index of the organic insulating layer.

The organic insulation layer may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin. The high refractive index layer may include a siloxane-based resin. The high refraction layer may include at least one of zirconium oxide particles, aluminum oxide particles, or titanium oxide particles other than the siloxane-based resin.

Light emitted from the pixel may be provided to the optical layer 140. According to the difference in refractive index between the high refraction layer and the organic insulation layer, the light may be reflected from a side surface of the organic insulation layer in which the openings are defined. The light may be reflected from the side surface of the organic insulation layer in which the openings are defined, so that the moving direction thereof may be controlled, and accordingly, the front surface luminance of the display panel 100 may be improved.

According to some embodiments of the inventive concept, at least one of the anti-reflection layer 130 or the optical layer 140 may be omitted. In addition, the structural relationship may be changed differently from what is illustrated in FIG. 3A. For example, the optical layer 140 may be provided by being included in the sensor layer 120, and also, the anti-reflection layer 130 may be provided by being included in the sensor layer 120. In this case, the function of the anti-reflection layer 130 or the optical layer 140 may be implemented by using insulation layers constituting the sensor layer 120.

Figure 3B:
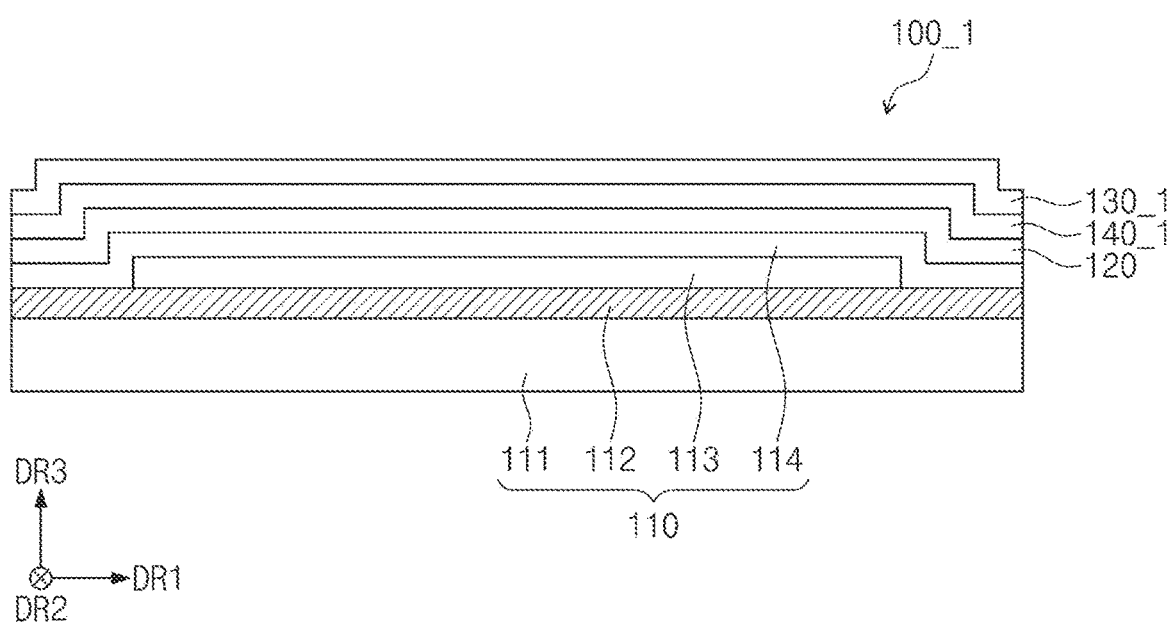
FIG. 3B is a cross-sectional view of a display panel according to some embodiments of the inventive concept.

FIG. 3B is a cross-sectional view of a display panel according to some embodiments of the inventive concept.

Referring to FIG. 3B, a display panel 100_1 may include a display layer 110, a sensor layer 120, an optical layer 140_1, and an anti-reflection layer 130_1. When the display panel 100_1 of FIG. 3B and the display panel 100 of FIG.

3A are compared, there is a difference in the stacking order of the optical layer 140_1 and the anti-reflection layer 130_1.

The optical layer 140_1 may be located on the sensor layer 120. The optical layer 140_1 may be formed on the sensor layer 120 through a series of processes.

The optical layer 140_1 may improve the front surface luminance of the display panel 100 by controlling the direction of light incident from the display layer 110.

The anti-reflection layer 130_1 may be located on the optical layer 140_1. The anti-reflection layer 130_1 may reduce the reflectance of external light incident from the outside of the display panel 100_1. The anti-reflection layer 130_1 may include a polarizing film, and the polarizing film may include a phase retarder and/or a polarizer. According to some embodiments, the anti-reflection layer 130_1 may be coupled to the optical layer 140_1 through an adhesive layer. The adhesive layer may be a transparent adhesive layer such as a pressure sensitive adhesive film (PSA), an optically clear adhesive film (OCA), or an optically clear resin (OCR).

According to some embodiments of the inventive concept, at least one of the anti-reflection layer 130_1 or the optical layer 140_1 may be omitted. Alternatively, the optical layer 140_1 may be provided by being included in the sensor layer 120. In this case, a layer which implements the function of the optical layer 140_1 may be provided by using insulation layers constituting the sensor layer 120.

Figure 3C:
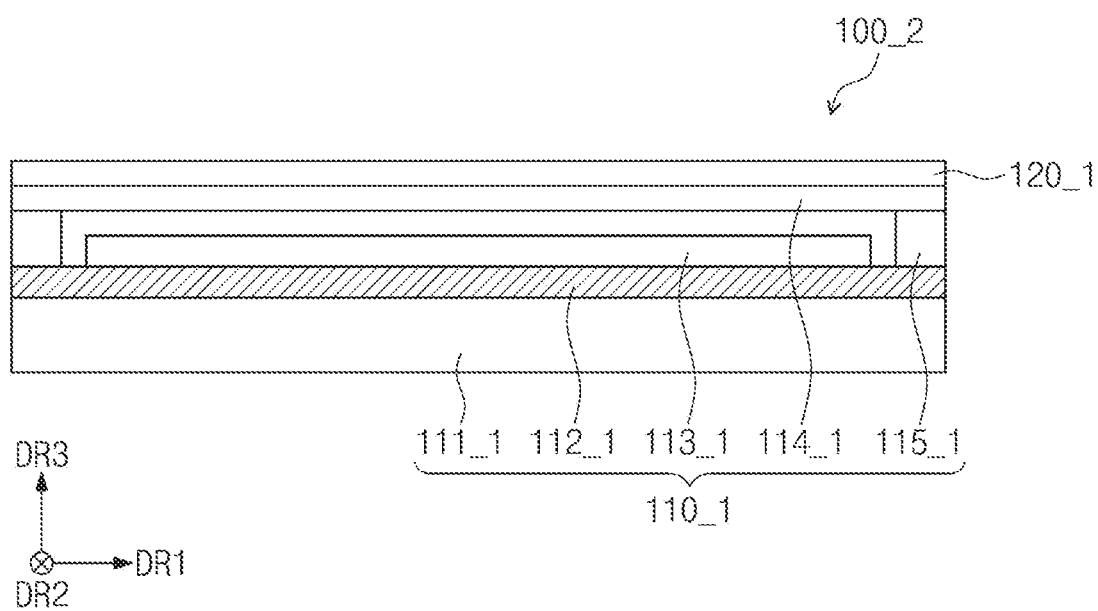
FIG. 3C is a cross-sectional view of a display panel according to some embodiments of the inventive concept.

FIG. 3C is a cross-sectional view of a display panel according to some embodiments of the inventive concept.

Referring to FIG. 3C, a display panel 100_2 may include a display layer 110_1 and a sensor layer 120_1. The display layer 110_1 may include a base substrate 111_1, a circuit layer 112_1, a light emitting element layer 113_1, an encapsulation substrate 114_1, and a coupling member 115_1.

Each of the base substrate 111_1 and the encapsulation substrate 114_1 may be a glass substrate, a metal substrate, a polymer substrate, or the like, but the embodiments of the inventive concept are not particularly limited thereto.

The coupling member 115_1 may be located between the base substrate 111_1 and the encapsulation substrate 114_1. The coupling member 115_1 may couple the encapsulation substrate 114_1 to the base substrate 111_1 or to the circuit layer 112_1. The coupling member 115_1 may include an inorganic material or an organic material. For example, the inorganic material may include frit seal, and the organic material may include a photo-curable resin or a photo-plastic resin. However, the material constituting the coupling member 11_1 is not limited to the above examples.

The sensor layer 120_1 may be directly located on the encapsulation substrate 114_1. Being directly located may mean that a third component is not located between the sensor layer 120_1 and the display layer 110_1. That is, a separate coupling member may not be located between the sensor layer 120_1 and the display layer 110_1. However, the embodiments of the inventive concept are not limited thereto. An adhesive layer may be further located between the sensor layer 120_1 and the encapsulation substrate 114_1.

Figure 4:
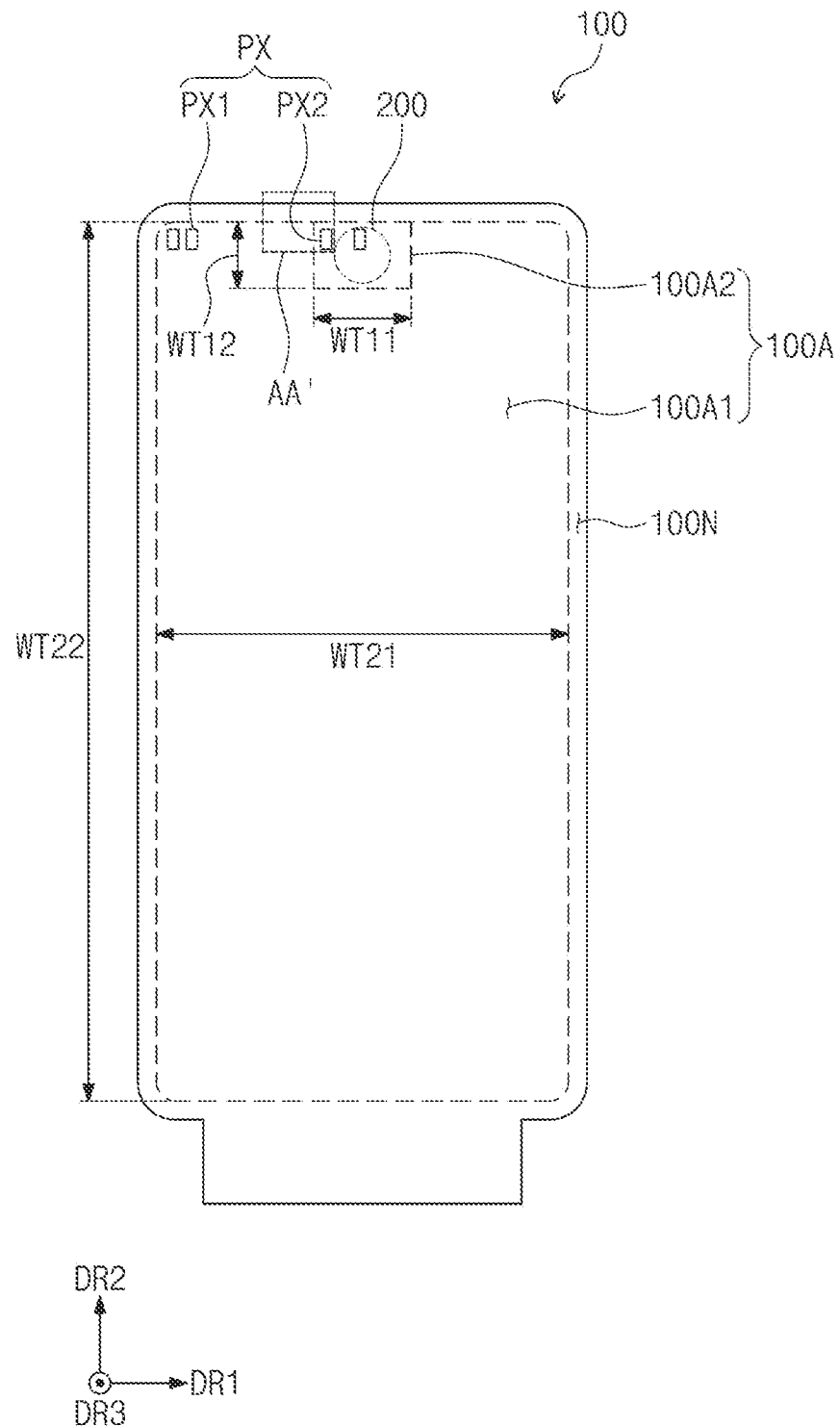
FIG. 4 is a plan view of a display panel according to some embodiments of the inventive concept.

FIG. 4 is a plan view of a display panel according to some embodiments of the inventive concept.

Referring to FIG. 4, the display region 100A may include a first display region 100A1 and a second display region 100A2. The electronic module 200 may be located below the second display region 100A2. That is, the sensing region 100SA (see FIG. 2) may be included in the second display region 100A2.

In the display region 100A, a plurality of pixels PX (hereinafter, pixels) may be located. Each of the pixels PX may include a light emitting element and a pixel circuit electrically connected to the light emitting element. The pixels PX may include first pixels PX1 located in the first display region 100A1 and second pixels PX2 located in the second display region 100A2.

The transmittance of the first display region 100A1 and the transmittance of the second display region 100A2 may be different from each other. For example, the transmittance of the second display region 100A2 may be higher than the transmittance of the first display region 100A1.

In order to increase the transmittance of the second display region 100A2 to be higher than the transmittance of the first display region 100A1, at least some components located in the second display region 100A2 may be omitted, or may be moved to another region other than the second display region 100A2 and located therein.

The density of the second pixels PX2 located in the second display region 100A2 may be lower than the density of the first pixels PX1 located in the first display region 100A1. In this case, the resolution of the second display region 100A2 may be lower than the resolution of the first display region 100A1, but the transmittance of the second display region 100A2 may be higher than the first display region 100A1.

The light emitting element of each of the second pixels PX2 may be located in the second display region 100A2, and the pixel circuit of each of the second pixels PX2 may be located in the peripheral region 100N. In this case, the transmittance of the second display region 100A2 may be further increased than the transmittance of a case in which the pixel circuit of each of the second pixels PX2 is located in the second display region 100A2.

The second display region 100A2 may have a quadrangular shape. At least three sides of the second display region 100A2 may be in contact with the first display region 100A1. However, embodiments according to the inventive concept are not limited thereto. For example, depending on the position of the electronic module 200, the second display region 100A2 may be completely surrounded by the first display region 100A1.

A maximum width WT11 of the second display region 100A2 in the first direction DR1 may be less than a maximum width WT21 of the first display region 100A1 in the first direction DR1. In addition, a maximum width WT12 of the second display region 100A2 in the second direction DR2 may be less than a maximum width WT22 of the first display region 100A1 in the second direction DR2. The maximum width WT21 of the first display region 100A1 is a maximum width of the display region 100A in the first direction DR1, and the maximum width WT22 of the first display region 100A1 may be a maximum width of the display region 100A in the second direction DR2. The maximum width in the first direction DR1 means the maximum width in parallel with the first direction DR1, and the maximum width in the second direction DR2 means the maximum width in parallel with the second direction DR2.

Figure 5:
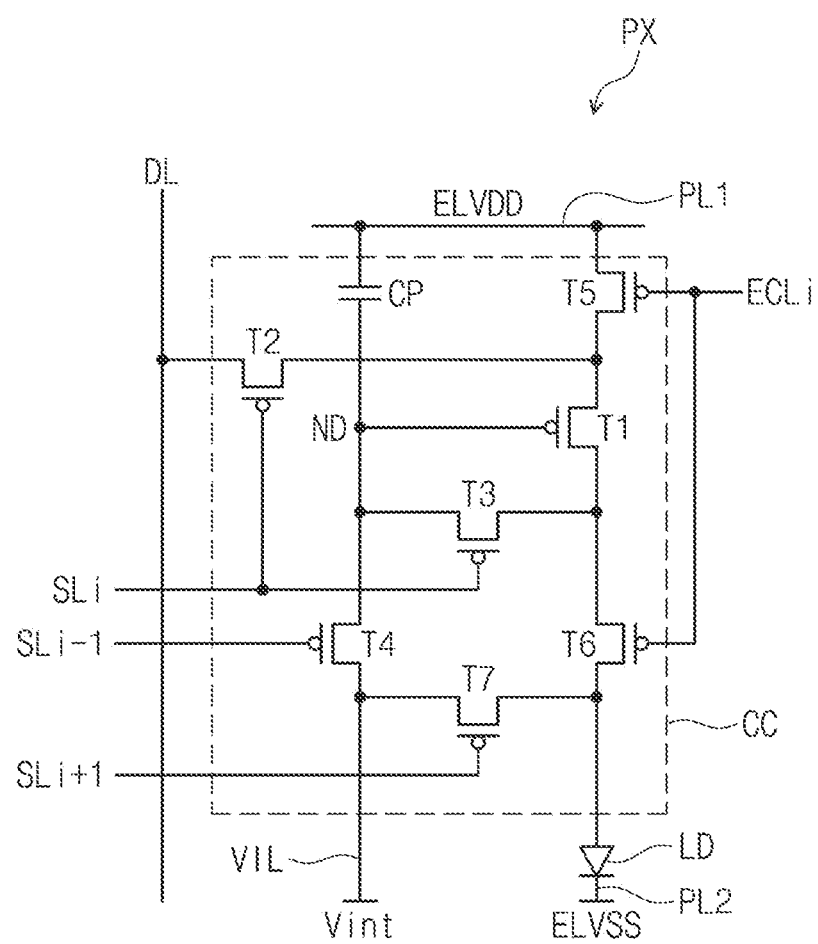
FIG. 5 is an equivalent circuit diagram of a pixel according to some embodiments of the inventive concept.

FIG. 5 is an equivalent circuit diagram of a pixel according to some embodiments of the inventive concept.

Referring to FIG. 5, a pixel PX may include a light emitting element LD and a pixel circuit CC. The light emitting element LD may be a component included in the light emitting element layer 113 of FIG. 3A, and the pixel circuit CC may be a component included in the circuit layer 112 of FIG. 3A.

The pixel circuit CC may include a plurality of transistors T1, T2, T3, T4, T5, T6, and T7 and a capacitor CP. The pixel circuit CC may control the amount of current flowing through the light emitting element LD in correspondence to a data signal. The light emitting element LD may emit light having a luminance (e.g., a set or predetermined luminance) in correspondence to the amount of current provided from the pixel circuit CC. To this end, the level of a first power ELVDD may be set to be higher than the level of a second power ELVSS.

The pixel PX may be electrically connected to a plurality of signal lines. Among the signal lines, FIG. 5 illustrates example scan lines SLi, SLi−1, and SLi+1, a data line DL, a first power line PL1, a second power line PL2, an initialization power line VL, and a light emitting control line ECLi. However, this is only an example, and embodiments according to the present disclosure are not limited thereto. The pixel PX according to some embodiments of the inventive concept may be additionally connected to various other signal lines, and some of the illustrated signal lines may be omitted.

Each of the plurality of transistors T1, T2, T3, T4, T5, T6, and T7 may include an input electrode (or a source), an output electrode (or a drain), and a control electrode (or a gate). In the present specification, one of the input electrode and the output electrode may be referred to as a first electrode, and the other one thereof may be referred to as a second electrode for convenience.

A first electrode of a first transistor T1 may be connected to the first power line PL1 via a fifth transistor T5. The first power line PL1 may be a line provided with the first power ELVDD. A second electrode of the first transistor T1 is connected to a pixel electrode (or an anode) of the light emitting element LD via a sixth transistor T6. The first transistor T1 may be referred to as a driving transistor in the present specification.

The first transistor T1 may control the amount of current flowing in the light emitting element LD in correspondence to a voltage applied to a control electrode of the first transistor T1.

A second transistor T2 is connected between the data line DL and the first electrode of the first transistor T1. In addition, a control electrode of the second transistor T2 is connected to an i-th scan line SLi. When an i-th scan signal is provided to the i-th scan line SLi, the second transistor T2 is turned on to electrically connect the data line DL and the first electrode of the first transistor T1.

A third transistor T3 is connected between the second electrode of the first transistor T1 and the control electrode of the first transistor T1. A control electrode of the third transistor T3 is connected to the i-th scan line SLi. When an i-th scan signal is provided to the i-th scan line SLi, the third transistor T3 is turned on to electrically connect the second electrode of the first transistor T1 and the control electrode of the first transistor T1. Accordingly, when the third transistor T3 is turned on, the first transistor T1 is connected in the form of a diode.

A fourth transistor T4 is connected between a node ND and to the initialization power line VL. In addition, a control electrode of the fourth transistor T4 is connected to an i−1-th scan line SLi−1. The node ND may be a node to which the fourth transistor T4 and the control electrode of the first transistor T1 are connected. When an i−1-th scan signal is provided to the i−1-th scan line SLi−1, the fourth transistor T4 is turned on to provide an initialization voltage Vint to the node ND.

The fifth transistor T5 is connected between the first power line PL1 and the first electrode of the first transistor T1. The sixth transistor T6 is connected between the second electrode of the first transistor T1 and the pixel electrode of the light emitting element LD. A control electrode of the fifth transistor T5 and a control electrode of the sixth transistor T6 are connected to the i-th light emitting control line ECLi.

A seventh transistor T7 is connected between the initialization power line VL and the pixel electrode of the light emitting element LD. In addition, a control electrode of the seventh transistor T7 is connected to an i+1-th scan line SLi+1. When an i+1-th scan signal is provided to the i+1-th scan line SLi+1, the seventh transistor T7 is turned on to provide the initialization voltage Vint to the pixel electrode of the light emitting element LD.

The seventh transistor T7 may improve black expression capability of the pixel PX. For example, when the seventh transistor T7 is turned on, a parasitic capacitor of the light emitting element LD is discharged. Then, when black luminance is implemented, the light emitting element LD does not emit light due to a leakage current from the first transistor T1, and accordingly, the black expression capability may be improved.

FIG. 5 illustrates that the control electrode of the seventh transistor T7 is connected to the i+1-th scan line SLi+1, but the embodiments of the inventive concept are not limited thereto. According to some embodiments of the inventive concept, the control electrode of the seventh transistor T7 may be connected to the i−1-th scan line Sli−1, or the i-th scan line SLi.

Although FIG. 5 illustrates various transistors as a PMOS as an example, the embodiments of the inventive concept are not limited thereto. According to some embodiments of the inventive concept, the pixel circuit CC may be formed of one or more NMOS transistors, as a person having ordinary skill in the art would appreciate. According to some embodiments of the inventive concept, the pixel circuit CC may be formed of a combination of NMOS and PMOS transistors. That is, according to some embodiments, the pixel circuit CC may utilize any suitable combination of NMOS and PMOS transistors.

The capacitor CP is located between the first power line PL1 and the node ND. The capacitor CP stores a voltage corresponding to a data signal. When the fifth transistor T5 and the sixth transistor T6 are turned on, the amount of current flowing through the first transistor T1 may be determined in accordance with the voltage stored in the capacitor CP.

The light emitting element LD may be electrically connected to the sixth transistor T6 and the second power line PL2. The light emitting element LD may receive the second power ELVSS through the second power line PL2.

The light emitting element LD may emit light to a voltage corresponding to the difference between a signal transmitted through the sixth transistor T6 and the second power ELVSS received through the second power line PL2.

An equivalent circuit of the pixel circuit CC is not limited to the equivalent circuit illustrated in FIG. 5. According to some embodiments of the inventive concept, the pixel circuit CC may be modified into various forms for emitting the light emitting element LD. According to some embodiments, the pixel circuit CC may include additional electronic components or fewer electronic components without departing from the spirit and scope of embodiments according to the present disclosure.

Figure 6:
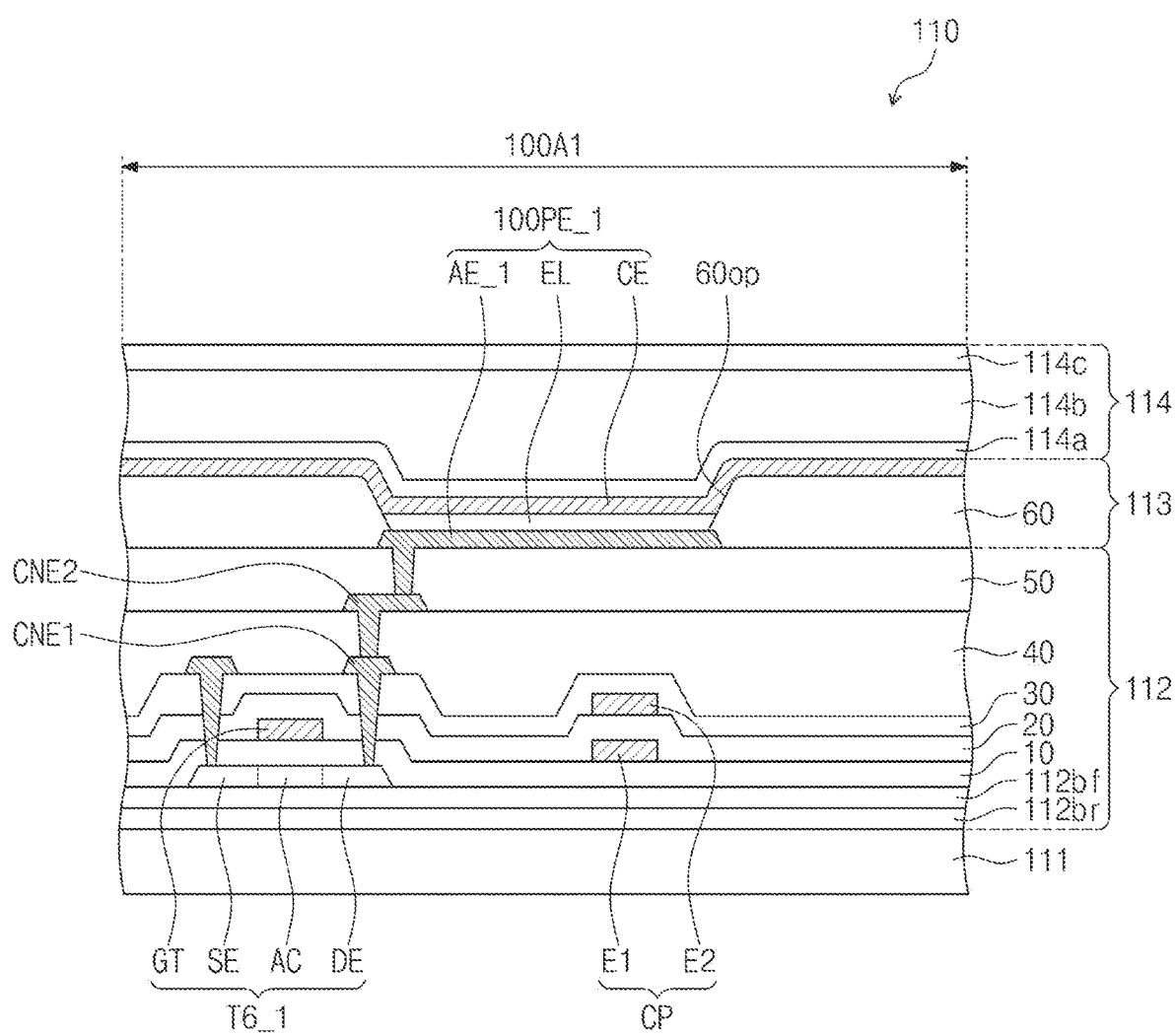
FIG. 6 is a cross-sectional view of a display layer according to some embodiments of the inventive concept.

FIG. 6 is a cross-sectional view of a display layer according to some embodiments of the inventive concept.

Referring to FIG. 6, the display layer 110 may include a plurality of insulation layers, a semiconductor pattern, a conductive pattern, a signal line, and the like. An insulation layer, a semiconductor layer, and a conductive layer are formed by coating, deposition, and the like. Thereafter, the insulation layer, the semiconductor layer, and the conductive layer may be selectively patterned by photolithography. The semiconductor pattern, the conductive pattern, the signal line, and the like included in the circuit layer 112 and the light emitting element layer 113 are formed in the above manner. Thereafter, the encapsulation layer 114 which covers the light emitting element layer 113 may be formed.

At least one inorganic layer is formed on an upper surface of the base layer 111. The inorganic layer may include at least one of aluminum oxide, titanium oxide, silicon oxide, silicon nitride, silicon oxynitride, zirconium oxide, or hafnium oxide. The inorganic layer may be formed as a multi-layered inorganic layer. The multi-layered inorganic layers may constitute a barrier layer 112br and/or a buffer layer 112bf.

The barrier layer 112br may be located on the base layer 111. The barrier layer 112br may include at least one of silicon oxide, silicon nitride, or silicon oxynitride. The buffer layer 112bf may be located on the barrier layer 112br. The buffer layer 112bf may improve the coupling force between the base layer 111 and the semiconductor pattern. The buffer layer 112bf may include at least one of silicon oxide, silicon nitride, or silicon oxynitride. For example, the buffer layer 112bf may include a structure in which a silicon oxide layer and a silicon nitride layer are alternately stacked.

The semiconductor pattern may be located on the buffer layer 112bf. The semiconductor pattern may include polysilicon. However, the embodiments of the inventive concept are not limited thereto. The semiconductor pattern may include amorphous silicon or an oxide semiconductor.

FIG. 6 only illustrates a portion of the semiconductor pattern, and the semiconductor pattern may be further located in another region. The semiconductor pattern may be arranged according to a specific rule across pixels. The semiconductor pattern may have different electrical properties depending on whether or not the semiconductor pattern is doped. The semiconductor pattern may include a first region having a high conductivity rate and a second region having a low conductivity rate. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped to a lower concentration than the first region.

The conductivity of the first region may be greater than the conductivity of the second region, and the first region may substantially serve as an electrode or a signal line. The second region may substantially correspond to an active region (or a channel) of a transistor. In other words, a portion of the semiconductor pattern may be an active region of the transistor, another portion thereof may be a source or a drain of the transistor, and the other portion thereof may be a connection electrode or a connection signal line.

FIG. 6 illustrates an example of a sixth transistor T6_1 and a light emitting element 100PE_1 included in a pixel. FIG. 6 is a cross-sectional view of the first display region 100A1.

A source SE, an active region AC, and a drain DE of the sixth transistor T6_1 may be formed from the semiconductor pattern. The source SE and the drain DE may be extended in opposite directions from the active region AC on a cross section.

A first insulation layer 10 may be located on the buffer layer 112bf. The first insulation layer 10 commonly overlaps a plurality of pixels, and may cover the semiconductor pattern. The first insulation layer 10 may be an inorganic layer and/or an organic layer, and may have a single-layered structure or a multi-layered structure. The first insulation layer 10 may include at least one of aluminum oxide, titanium oxide, silicon oxide, silicon nitride, silicon oxynitride, zirconium oxide, or hafnium oxide. According to some embodiments, the first insulation layer 10 may be a silicon oxide layer of a single layer. Not only the first insulation layer 10 but also an insulation layer of the circuit layer 112 to be described layer may be an inorganic layer and/or an organic layer, and may have a single-layered structure or a multi-layered structure. The inorganic layer may include at least one of the above-described materials, but the embodiments of the inventive concept are not limited thereto.

A gate GT of the sixth transistor T6_1 is located on the first insulation layer 10. The gate GT may be a portion of a metal pattern. The gate GT overlaps the active region AC. In a process of doping the semiconductor pattern, the gate GT may function as a mask.

A second insulation layer 20 is located on the first insulation layer 10, and may cover the gate GT. The second insulation layer 20 may be an inorganic layer and/or an organic layer, and may have a single-layered structure or a multi-layered structure. The second insulation layer 20 may include at least one of silicon oxide, silicon nitride, or silicon oxynitride. According to some embodiments, the second insulation layer 20 may have a multi-layered structure including a silicon oxide layer and a silicon nitride layer.

The capacitor CP may include a first electrode E1 and a second electrode E2 facing the first electrode E1. The first electrode E1 is located on the same layer as that of the gate GT, and may include the same material as that of the gate GT. For example, the first insulation E1 may be located between the first insulation layer 10 and the second insulation layer 20. The second electrode E2 may be located on the second insulation layer 20. The position of the capacitor CP is not limited to the example illustrated in FIG. 6. For example, the capacitor CP may be located on the first transistor T1 (see FIG. 5). That is, the capacitor CP may overlap the first transistor T1 (see FIG. 5). In this case, an area or space in which the pixel circuit CC (see FIG. 5)) is to be formed may be secured.

A third insulation layer 30 may be located on the second insulation layer 20, and the third insulation layer 30 may cover the second electrode E2. The third insulation layer 30 may have a single-layered structure or a multi-layered structure. For example, the third insulation layer 30 may have a multi-layered structure including a silicon oxide layer and a silicon nitride layer. A first connection electrode CNE1 may be located on the third insulation layer 30. The first connection electrode CNE1 may be connected to the drain DE of the sixth transistor T6_1 through a contact hole passing through the first to third insulation layers 10, 20, and 30.

A fourth insulation layer 40 may be located on the third insulation layer 30. The fourth insulation layer 40 may be an organic layer.

A second connection electrode CNE2 may be located on the fourth insulation layer 40. The second connection electrode CNE2 may be connected to the first connection electrode CNE1 through a contact hole passing through the fourth insulation layer 40.

A fifth insulation layer 50 is located on the fourth insulation layer 40, and may cover the second connection electrode CNE2. The fifth insulation layer 50 may be an organic layer.

The light emitting element layer 113 including the light emitting element 100PE_1 may be located on the circuit layer 112. The light emitting element 100PE_1 may include a first pixel electrode AE_1, a light emitting layer EL, and a common electrode CE.

The first pixel electrode AE_1 may be located on the fifth insulation layer 50. The first pixel electrode AE_1 may be connected to the second connection electrode CNE2 through a contact hole passing through the fifth insulation layer 50.

A pixel definition film 60 is located on the fifth insulation layer 50, and may cover a portion of the first pixel electrode AE_1. On the pixel definition film 60, an opening 60op is defined. The opening 60op of the pixel definition film 60 exposes at least a portion of the first pixel electrode AE_1.

The light emitting layer EL may be located on the first pixel electrode AE_1. The light emitting layer EL may be located in a region corresponding to the opening 60op. That is, the light emitting layer EL may be divided and formed in each of the pixels. When the light emitting layer EL is divided and formed in each of the pixels, each of the light emitting layers EL may emit light of at least one color of blue, red, or green. However, the embodiments of the inventive concept are not limited thereto, and the light emitting layer EL may be connected to the pixels and commonly provided. In this case, the light emitting layer EL may provide blue light or white light.

The common electrode CE may be located on the light emitting layer EL. The common electrode CE has an integral shape, and may be commonly located in the plurality of pixels.

According to some embodiments, a hole control layer may be located between the first pixel electrode AE_1 and the light emitting layer EL. The hole control layer includes a hole transport layer, and may further include a hole injection layer. An electron control layer may be located between the light emitting layer EL and the common electrode CE. The electron control layer includes an electron transport layer, and may further include an electron injection layer. The hole control layer and the electron control layer may be commonly formed in the plurality of pixels using an open mask.

The encapsulation layer 114 may be located on the light emitting element layer 113. The encapsulation layer 114 may include an inorganic layer 114a, an organic layer 114b, and an inorganic layer 114c sequentially stacked, but layers constituting the encapsulation layer 114 are not limited thereto.

The inorganic layers 114a and 114c may protect the light emitting element layer 113 from moisture and oxygen, and the organic layer 114b may protect the light emitting element layer 113 from foreign materials such as dust particles. The inorganic layers 114a and 114c may include a silicon nitride layer, a silicon oxynitride layer, a silicon oxide layer, a titanium oxide layer, an aluminum oxide layer, or the like. The organic layer 114b may include an acrylic organic layer, but is not limited thereto.

Figure 7:
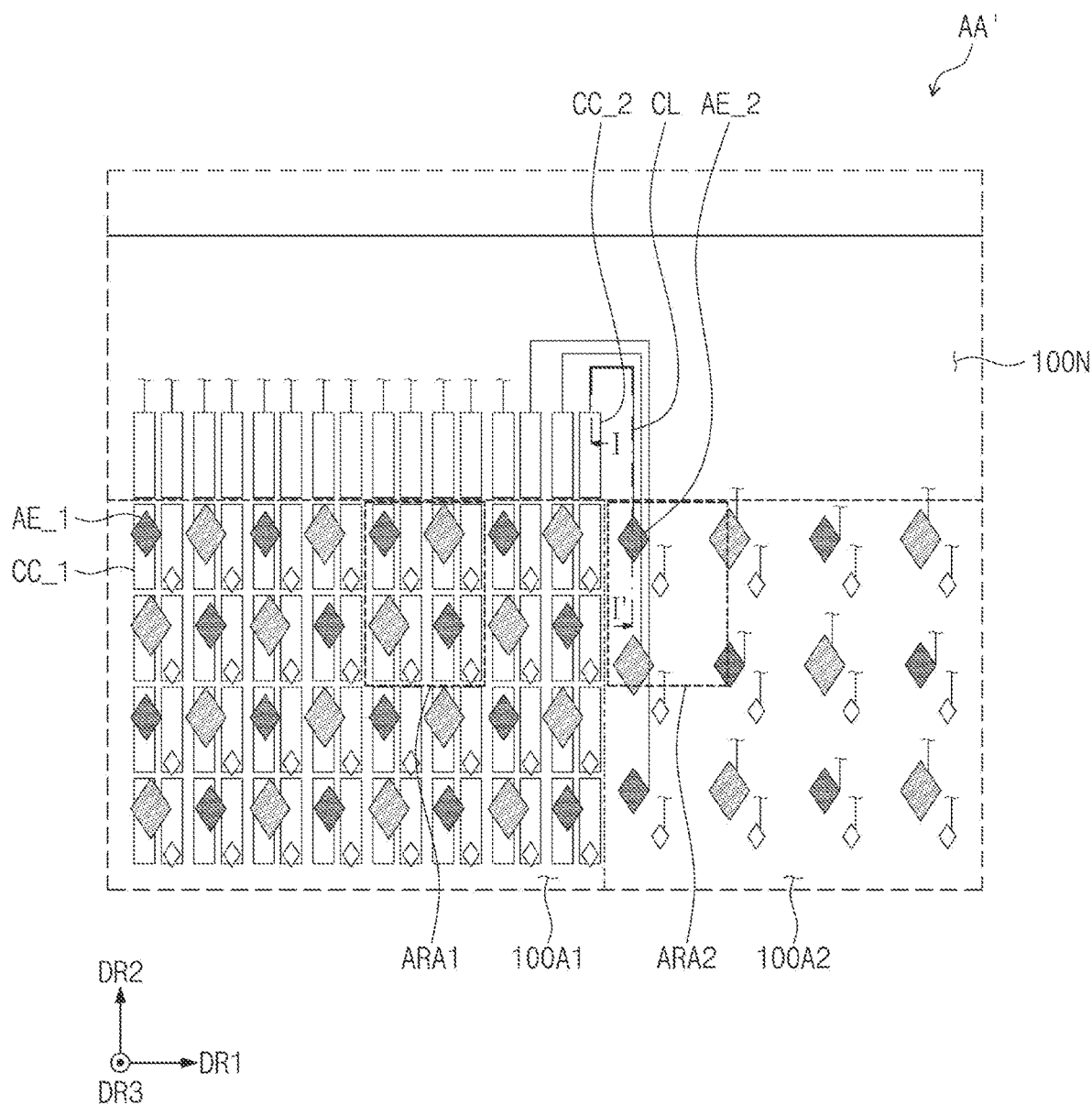
FIG. 7 is a plane view illustrating an enlarged view of the region AA' of FIG. 4.

FIG. 7 is a plane view illustrating an enlarged view of region AA' of FIG. 4.

Referring to FIG. 7, a plurality of first pixel electrodes AE_1 (hereinafter, first pixel electrodes), a plurality of second pixel electrodes AE_2 (hereinafter, second pixel electrodes), a plurality of first pixel circuits CC_1 (hereinafter, first pixel circuits), and a plurality of second pixel circuits CC_2 (hereinafter, second pixel circuits) are illustrated.

The first pixel electrodes AE_1 may be located in the first display region 100A1, and the second pixel electrodes AE_2 may be located in the second display region 100A2. The resolution of the first display region 100A1 may be higher than the resolution of the second display region 100A2. The density of the first pixel electrodes AE_1 may be higher than the density of the second pixel electrodes AE_2. The number of first pixel electrodes AE_1 (or a first number of first pixel electrode AE_1) located in a first region ARA1 among the first pixel electrodes AE_1 may be greater than the number of second pixel electrodes AE_2 (or a second number of second pixel electrodes AE_2) located in a second region ARA2 among the second pixel electrodes AE_2. The first region ARA1 and the second region ARA2 may be defined to have the same size and the same shape.

Each of the first pixel circuits CC_1 and the second pixel circuits CC_2 may have the same equivalent circuit as that of the pixel circuit CC (see FIG. 5) described with reference to FIG. 5. The first pixel circuits CC_1 may be electrically connected to the first pixel electrodes AE_1, respectively, and the second pixel circuits CC_2 may be electrically connected to the second pixel electrodes AE_2, respectively.

The first pixel circuits CC_1 may be located in the first display region 100A1. The second pixel circuits CC_2 may be spaced apart from the second pixel electrodes AE_2. For example, the second pixel circuits CC_2 may be located in the peripheral region 100N. When viewed in the third direction DR3 (e.g., from a direction perpendicular or normal to a plane of the display surface, or a plan view), the first pixel circuits CC_1 may respectively overlap the first pixel electrodes AE_1, and the second pixel circuits CC_2 may not overlap the second pixel electrodes AE_2.

The display panel 100 (see FIG. 2) may further include a plurality of connection lines CL (hereinafter, connection lines). The connection lines CL may electrically connect the second pixel electrodes AE_2 and the second pixel circuits CC_2, respectively. For example, one connection line CL may electrically connect one second pixel electrode AE_2 and one second pixel circuit CC_2. The one connection line CL may correspond to a line which connects the sixth transistor T6 (see FIG. 5) and the light emitting element LD (see FIG. 5) illustrated in FIG. 5.

A portion of each of the connection lines CL is also located in the second display region 100A2. Because the second display region 100A2 is a region overlapping the electronic module 200 (see FIG. 2), the portion of each of the connection lines CL may include a transparent conductive material. Therefore, the deterioration in transmittance of the second display region 100A2 caused by the connection lines CL may be reduced or minimized.

The transparent conductive material may include a transparent conductive oxide such as indium tin oxide (ITO), indium zinc oxide (IZO), zinc oxide (ZnO), indium tin zinc oxide (ITZO), or the like. In addition, the transparent conductive material may include a conductive polymer such as PEDOT, a metal nanowire, graphene, and the like, but the embodiments of the inventive concept are not particularly limited thereto.

Figure 8:
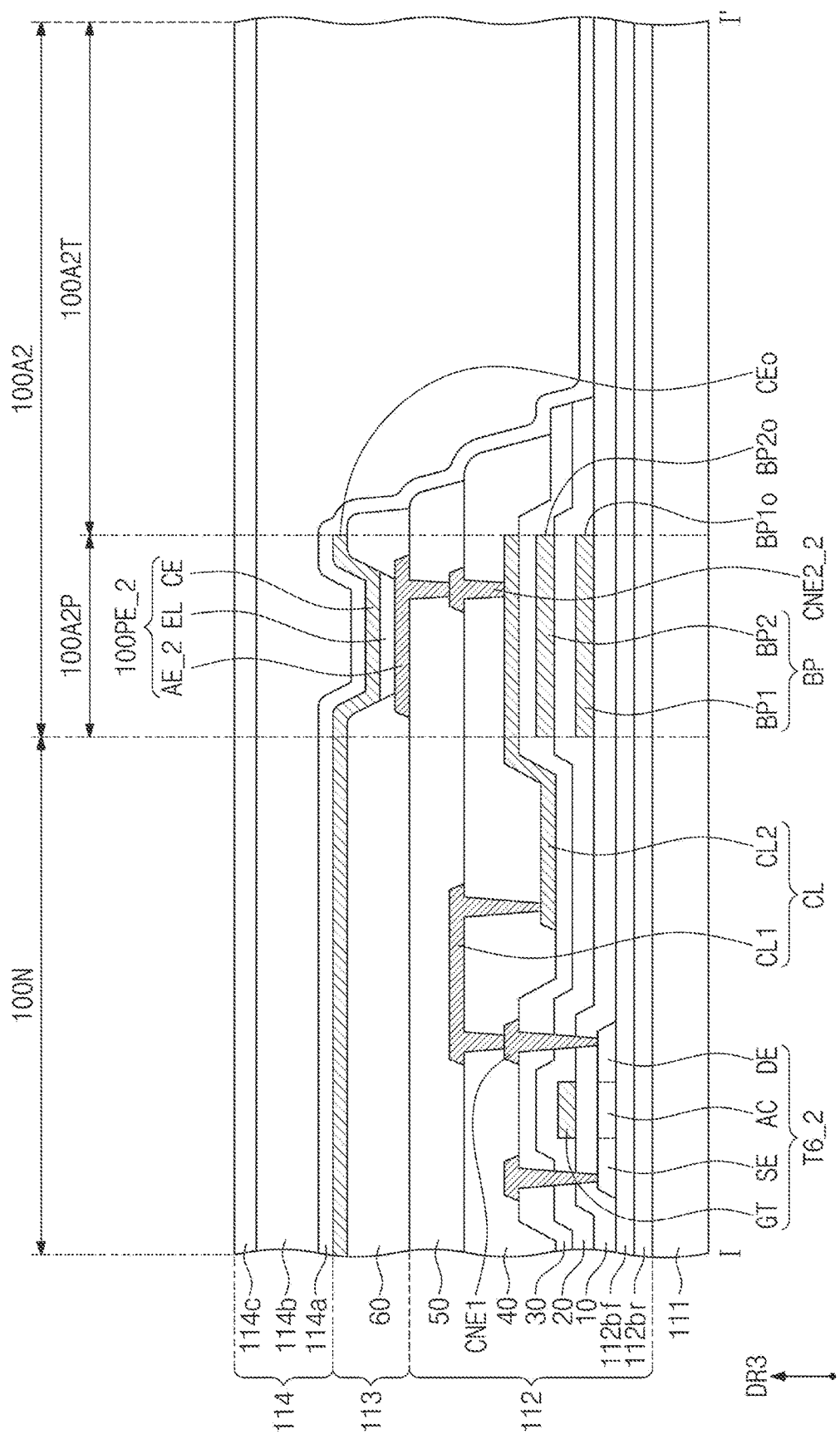
FIG. 8 is a cross-sectional view taken along the line I-I' illustrated in FIG. 7.

FIG. 8 is a cross-sectional view taken along the line I-I' illustrated in FIG. 7. FIG. 8 is a cross-sectional view of the second display region 100A2 and the peripheral region 100N.

Referring to FIG. 7 and FIG. 8, examples of a sixth transistor T6_2 and a light emitting element 100PE_2 included in a pixel are illustrated. Because the sixth transistor T6_2 is included in the second pixel circuits CC_2, the sixth transistor T6_2 may be located in the peripheral region 100N.

The second display region 100A2 may be include a first sub-region 100A2P and a second sub-region 100A2T. The first sub-region 100A2P may be a region in which the light emitting element 100PE_2 is located, and the second sub-region 100A2T may be a region in which the light emitting element 100PE_2 is not located. According to some embodiments of the inventive concept, a portion of the common electrode CE overlapping the second sub-region 100A2T may be removed. Therefore, in the common electrode CE, an opening CEo may be defined, and the opening CEo may correspond to the second sub-region 100A2T. When the common electrode CE is removed from the second sub-region 100A2T, the transmittance of the second sub-region 100A2T may be improved. For reference, in FIG. 8, an indicator line which indicates the opening CEo is displayed on a sidewall defining the opening CEo.

The light emitting element 100PE_2 may include the second pixel electrode AE_2, the light emitting layer EL, and the common electrode CE. The second pixel electrode AE_2 may be electrically connected to the second pixel circuits CC_2. For example, the second pixel electrode AE_2 may be electrically connected to the sixth transistor T6_2 through the connection line CL.

According to some embodiments of the inventive concept, the connection line CL may include a first connection portion CL1 and a second connection portion CL2. The second pixel electrode AE_2 may be electrically connected to the second connection portion CL2 through a second connection electrode CNE2_2.

The first connection portion CL1 may be located in the peripheral region 100N. The first connection portion CL1 may come into an electrical contact with the first connection electrode CNE1. The first connection portion CL1 is located on the same layer as that of the second connection electrode CNE2 (see FIG. 6) and may include the same material as that of the second connection electrode CNE2 (see FIG. 6).

The second connection portion CL2 may be located in the peripheral region 100N and the second display region 100A2. The second connection portion CL2 may be located on the same layer as that of the first connection electrode CNE1. For example, the second connection portion CL2 may be located between the third insulation layer 30 and the fourth insulation layer 40. The second connection portion CL2 is located on the same layer as that of the first connection electrode CNE1, but the second connection portion CL2 may include a different material from that of the first connection electrode CNE1. For example, the second connection portion CL2 may include a transparent conductive material. Therefore, even when the second connection portion CL2 is located in the second display region 100A2, the deterioration in transmittance of the second display region 100A2 caused by the second connection portion CL2 may not be great.

Unlike what is illustrated in FIG. 8, the connection line CL may be composed of only the second connection portion CL2. In this case, the second connection portion CL2 may come into contact with the first connection electrode CNE1.

Below the second pixel electrode AE_2, a blocking pattern BP may be located. The blocking pattern BP may be spaced apart from the common electrode CE with the second pixel electrode AE_2 interposed therebetween. The blocking pattern BP may be a pattern serves as a mask when the opening CEo is formed in the common electrode CE. The blocking pattern BP may include a non-transparent metal. The blocking pattern BP may referred to as a blocking layer.

The blocking pattern BP may include a first blocking pattern BP1 and a second blocking pattern BP2. The second blocking pattern BP2 may be located on the first blocking pattern BP1, and the second blocking pattern BP2 may be located between the first blocking pattern BP1 and the second pixel electrode AE_2. When viewed in the third direction DR3, the first blocking pattern BP1, the second blocking pattern BP2, and the second pixel electrode AE_2 may overlap each other.

The first blocking pattern BP1 may be located between the first insulation layer 10 and the second insulation layer 20. For example, the first blocking pattern BP1 is located on the same layer as that of the gate GT, and may include the same material as that of the gate GT.

The second blocking pattern BP2 may be located between the second insulation layer 20 and the third insulation layer 30. For example, the second blocking pattern BP2 is located on the same layer as that of the second electrode E2 (see FIG. 6) of the capacitor CP (see FIG. 6), and may include the same material as that of the second electrode E2 (see FIG. 6).

In the first blocking pattern BP1, a first transmission portion BP1o is defined, and in the second blocking pattern BP2, a second transmission portion BP2o may be located. During a process of manufacturing the display panel 100 (see FIG. 2), a portion of the common electrode CE overlapping the first transmission portion BP1o and the second transmission portion BP2o is removed, so that the opening CEo of the common electrode CE may be formed. Therefore, the first transmission portion BP1o, the second transmission portion BP2o, and the opening CEo of the common electrode CE may all overlap in the third direction DR3.

Figure 9:
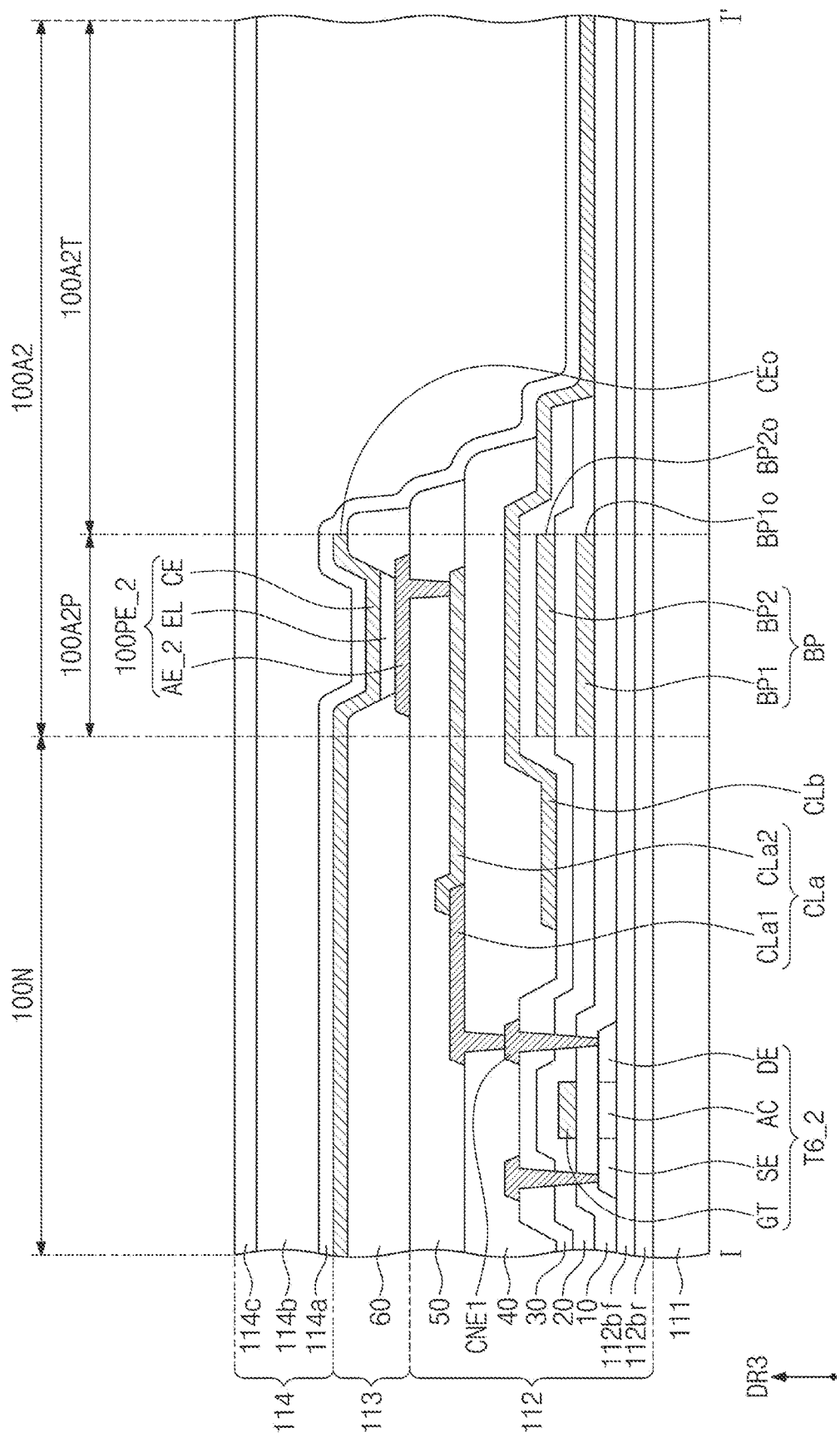
FIG. 9 is a cross-sectional view of a display layer according to some embodiments of the inventive concept.

FIG. 9 is a cross-sectional view of a display layer according to some embodiments of the inventive concept. In describing FIG. 9, components which are the same as those described with reference to FIG. 8 are denoted by the same reference numerals, and descriptions thereof are omitted.

Referring to FIG. 9, the second pixel electrode AE_2 may be electrically connected to the sixth transistor T6_2 through a first connection line CLa. According to some embodiments, another second pixel electrode located in the second display region 100A2 may be electrically connected to a sixth transistor corresponding to the another second pixel electrode through a second connection line CLb.

According to some embodiments of the inventive concept, the first connection line CLa may include a first connection portion CLa1 and a second connection portion CLa2. The second connection portion CLa2 may be located in the peripheral region 100N and the second display region 100A2. For example, the first connection portion CLa1 is located on the same layer as that of the second connection electrode CNE2 (see FIG. 6) and may include the same material as that of the second connection electrode CNE2 (see FIG. 6). The first connection portion CLa1 and the second connection electrode CLa2 are located on the same layer, and may include different materials. The second connection portion CLa2 may include a transparent conductive material. In addition, the second connection line CLb may also include a transparent conductive material.

According to some embodiments, as illustrated in FIG. 9, a connection line located in the second display region 100A2 and including a transparent conductive material may be provided as having at least two layers. Second pixel electrodes located in the second display region 100A2 may be electrically connected to pixel circuits located in the peripheral region 100N by using connection lines each including a transparent conductive material.

Below the second pixel electrode AE_2, the blocking pattern BP may be located. The blocking pattern BP may be spaced apart from the common electrode CE with the second pixel electrode AE_2 interposed therebetween. The blocking pattern BP may be a pattern serves as a mask when the opening CEo is formed in the common electrode CE.

Figure 10A:
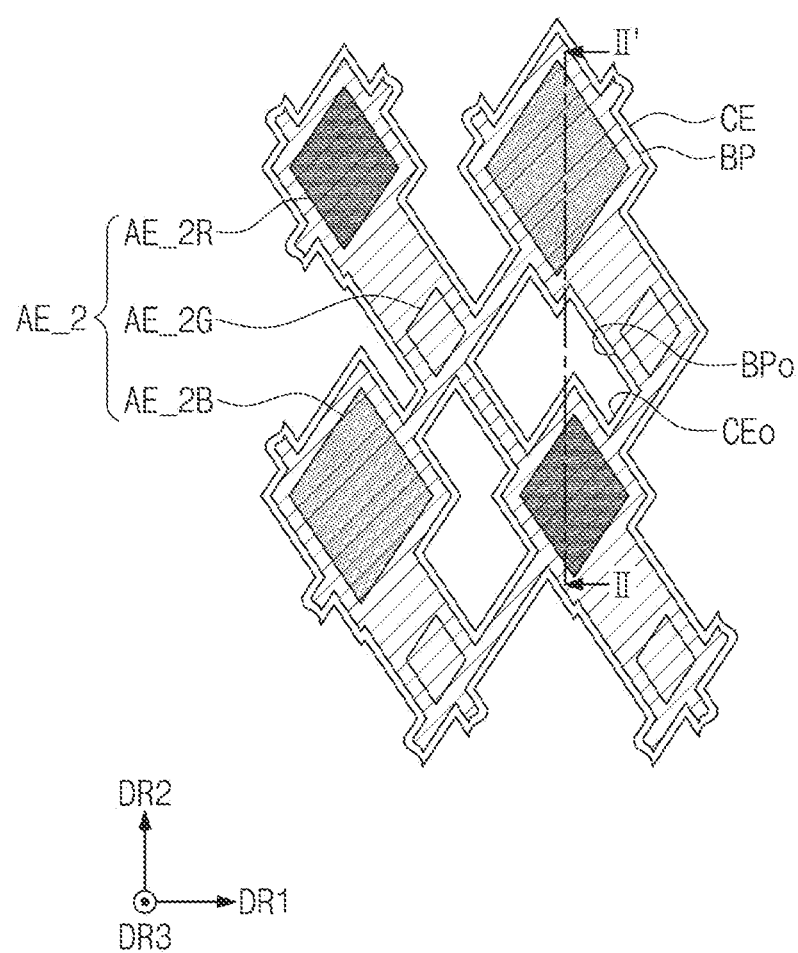
FIG. 10A is a plan view illustrating some enlarged components of a display layer according to some embodiments of the inventive concept.

FIG. 10A is a plan view illustrating some enlarged components of a display layer according to some embodiments of the inventive concept.

FIG. 4 and FIG. 10A illustrate the second electrodes AE_2, the blocking pattern BP, and the common electrode CE located in the second display region 100A2. In the blocking pattern BP, a plurality of transmission portions BPo (hereinafter, transmission portions) may be defined. When viewed in the third direction DR3, the transmission portions BPo may be spaced apart from the second pixel electrodes AE_2. That is, the transmission portions BPo may not overlap the second pixel electrodes AE_2.

The blocking pattern BP may be a pattern serving as a mask in a process of removing a portion of the common electrode CE. A portion of the common electrode CE overlapping the blocking pattern BP may not be removed, and portions of the common electrode CE overlapping the transmission portions BPo of the blocking pattern BP may be removed. In the portions of the common electrode CE overlapping the transmission portions BPo, a plurality of the openings CEo may be defined. The blocking pattern BP may be used during a process of patterning the common electrode CE. A detailed description thereof will be followed.

According to some embodiments of the inventive concept, because a portion of the common electrode CE is removed, the transmittance in the second display region 100A2 may be increased, and the aperture ratio in the second display region 100A2 may also be improved.

Taking a case in which the electronic module 200 is a camera for example, because the openings CEo are defined in the common electrode CE in the second display region 100A2, haze(or light smear) of an image captured by the electronic module 200 may be reduced. In addition, because the transmittance in the second display region 100A2 is improved, the image quality of an image captured by the electronic module 200 in a low illuminance environment may be improved.

The second pixel electrodes AE_2 may include a red pixel electrode AE-2R, a green pixel electrode AE_2G, and a blue pixel electrode AE_2B. The red pixel electrode AE-2R, the green pixel electrode AE_2G, and the blue pixel electrode AE_2B may include the same material. The display panel 100 may emit red light in a region overlapping the red pixel electrode AE-2R, green light in a region overlapping the green pixel electrode AE_2G, and blue light in a region overlapping the blue pixel electrode AE_2B.

The red pixel electrode AE-2R, the green pixel electrode AE_2G, and the blue pixel electrode AE_2B may be arranged according to a rule (e.g., a set or predetermined rule). The red pixel electrode AE-2R, the green pixel electrode AE_2G, and the blue pixel electrode AE_2B may be arranged according to a similar rule in the first display region 100A1 and the second display region 100A2. For example, the red pixel electrode AE-2R, the green pixel electrode AE_2G, and the blue pixel electrode AE_2B may be arranged according to the same rule in the first display region 100A1 and the second display region 100A2, while just having different arrangement intervals. However, this is only an example, and the embodiments of the inventive concept are not particularly limited thereto.

Figure 10B:
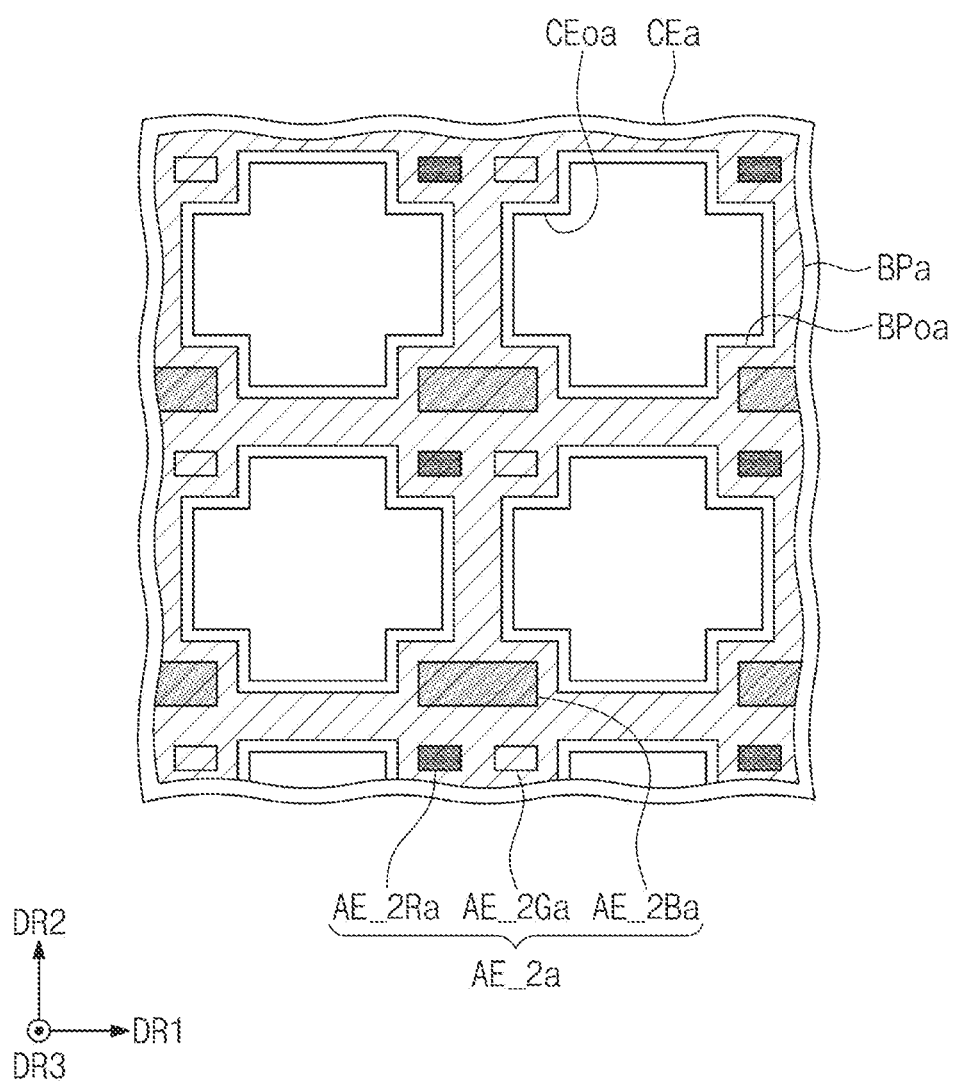
FIG. 10B is a plan view illustrating some enlarged components of a display layer according to some embodiments of the inventive concept.

FIG. 10B is a plan view illustrating some enlarged components of a display layer according to some embodiments of the inventive concept.

FIG. 4 and FIG. 10B illustrate the second electrodes AE_2a, the blocking pattern BPa, and the common electrode CEa located in the second display region 100A2. In the blocking pattern BPa, a plurality of transmission portions BPoa (hereinafter, transmission portions) may be defined. When viewed in the third direction DR3, the transmission portions BPoa may be spaced apart from the second pixel electrodes AE_2a. That is, the transmission portions BPoa may not overlap the second pixel electrodes AE_2a. In portions of the common electrode CEa overlapping the transmission portions BPoa, a plurality of openings CEoa may be defined.

According to some embodiments of the inventive concept, the common electrode CEa may be patterned by using the blocking pattern BPa. Because a portion of the common electrode CEa is removed, the transmittance in the second display region 100A2 may be increased, and the aperture ratio in the second display region 100A2 may also be improved.

The second pixel electrodes AE_2a may include a red pixel electrode AE-2Ra, a green pixel electrode AE_2Ga, and a blue pixel electrode AE_2Ba. The red pixel electrode AE-2Ra, the green pixel electrode AE_2Ga, and the blue pixel electrode AE_2Ba may be arranged according to a rule (e.g., a set or predetermined rule) in the second display region 100A2.

The size of the blue pixel electrode AE_2Ba may be larger than the size of each of the red pixel electrode AE-2Ra and the green pixel electrode AE_2Ga. One blue pixel electrode AE_2Ba may be adjacent to one red pixel electrode AE-2Ra and one green pixel electrode AE_2Ga in the second direction DR2. One red pixel electrode AE-2Ra and one green pixel electrode AE_2Ga may be adjacent to each other in the first direction DR1.

Each of the transmission portions BPoa and each of the openings CEoa may have a cross shape. However, the shape of each of the transmission portions BPoa and each of the openings CEoa is not particularly limited thereto. For example, each of the transmission portions BPoa and each of the openings CEoa may be modified into various shapes, while only being spaced apart from the red pixel electrode AE-2Ra, the green pixel electrode AE_2Ga, and the blue pixel electrode AE_2Ba.

Figure 10C:
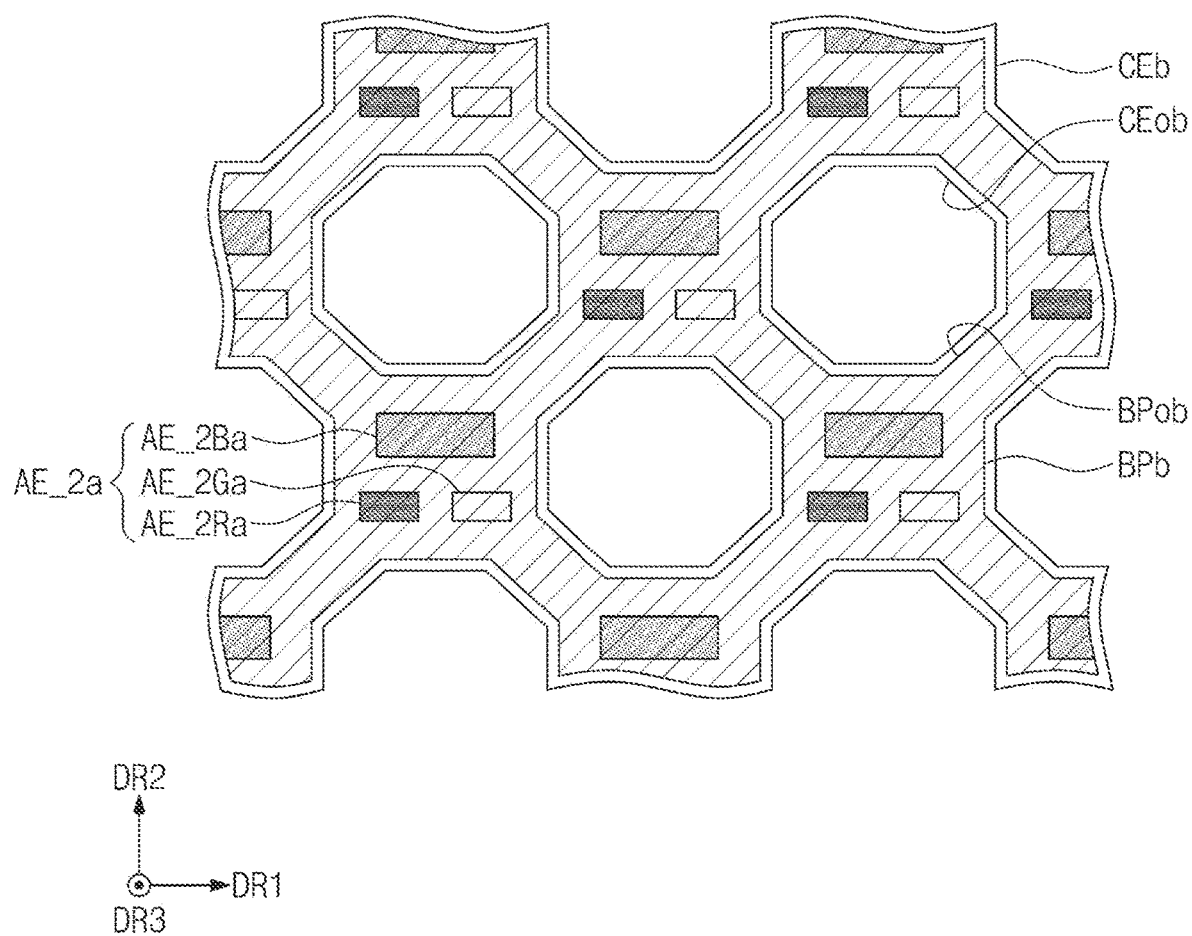
FIG. 10C is a plan view illustrating some enlarged components of a display layer according to some embodiments of the inventive concept.

FIG. 10C is a plan view illustrating some enlarged components of a display layer according to some embodiments of the inventive concept.

FIG. 4 and FIG. 10C illustrate the second electrodes AE_2a, a blocking pattern BPb, and a common electrode CEb located in the second display region 100A2. In the blocking pattern BPb, a plurality of transmission portions BPob (hereinafter, transmission portions) may be defined. When viewed in the third direction DR3, the transmission portions BPob may be spaced apart from the second pixel electrodes AE_2a. That is, the transmission portions BPob may not overlap the second pixel electrodes AE_2a. In portions of the common electrode CEb overlapping the transmission portions BPob, a plurality of openings CEob may be defined.

When compared with FIG. 10B, there is a difference in the shape of the transmission portions BPob and the openings CEob of FIG. 10C. Each of the transmission portions BPob and each of the openings CEob may have a hexagonal shape. In this case, according to some embodiments, as illustrated in FIG. 10C, the transmittance may be reduced when compared with each of the transmission portions BPob and each of the openings CEob illustrated in FIG. 10B, but diffraction of light passing through the display panel 100 may be reduced. As the diffraction of the light is reduced, the image quality of an image captured by the electronic module 200 may be improved.

The shape of each of the transmission portions BPob and each of the openings CEob is not limited to the shapes illustrated in FIG. 10B and FIG. 10C. For example, each of the transmission portions BPob and each of the openings CEob may have a polygonal shape or a circular shape.

Figure 10D:
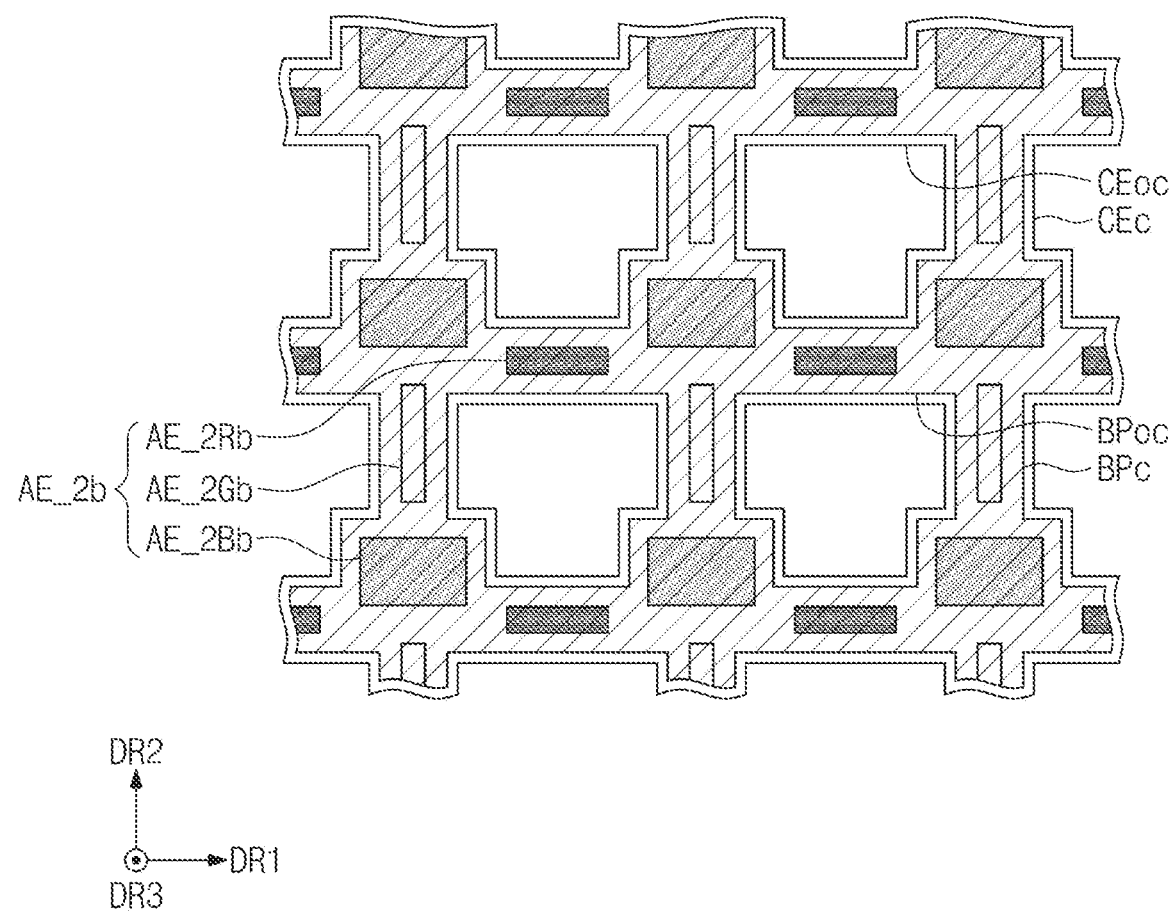
FIG. 10D is a plan view illustrating some enlarged components of a display layer according to some embodiments of the inventive concept.

FIG. 10D is a plan view illustrating some enlarged components of a display layer according to some embodiments of the inventive concept.

FIG. 4 and FIG. 10D illustrate the second electrodes AE_2b, a blocking pattern BPc, and a common electrode CEc located in the second display region 100A2. In the blocking pattern BPc, a plurality of transmission portions BPoc (hereinafter, transmission portions) may be defined. When viewed in the third direction DR3, the transmission portions BPoc may be spaced apart from the second pixel electrodes Ae_2b. That is, the transmission portions BPoc may not overlap the second pixel electrodes AE_2b. In portions of the common electrode CEc overlapping the transmission portions BPoc, a plurality of openings CEoc may be defined.

The second pixel electrodes AE_2b may include a red pixel electrode AE-2Rb, a green pixel electrode AE_2Gb, and a blue pixel electrode AE_2Bb. The red pixel electrode AE-2Rb, the green pixel electrode AE_2Gb, and the blue pixel electrode AE_2Bb may be arranged according to a rule (e.g. a set or predetermined rule) in the second display region 100A2. For example, the red pixel electrode AE-2Rb and the blue pixel electrode AE_2Bb may be arranged alternately and repeatedly along the first direction DR1, and the green pixel electrode AE_2Gb and the blue pixel electrode AE_2Bb may be arranged alternately and repeatedly.

The width of the red pixel electrode AE-2Rb in the first direction DR1 may be greater than the width of the red pixel electrode AE-2Rb in the second direction DR2. The width of the green pixel electrode AE_2Gb in the first direction DR1 may be smaller than the width of the green pixel electrode AE_2Gb in the second direction DR2.

FIG. 10A to FIG. 10D illustrate an example of the arrangement of pixel electrodes located in the second display region 100A2, the shape of transmission portions of a blocking pattern, and the shape of openings of a common electrode, but the embodiments of the inventive concept are not limited thereto. If only transmission portions of a blocking pattern and openings of a common electrode overlap each other, the arrangement of pixel electrodes, the shape of the transmission portions of a blocking pattern, and the shape of the openings of a common electrode may be variously modified.

FIG. 10A to FIG. 10D illustrate that the transmission portions BPo, BPoa, BPob, and BPoc surround the openings CEo, CEoa, CEob, and CEoc. However, this is only to distinguish the transmission portions BPo, BPoa, BPob, and BPoc from the openings CEo, CEoa, CEob, and CEoc. The embodiments of the inventive concept are not limited thereto. When viewed in the third direction DR3, the transmission portions BPo, BPoa, BPob, and BPoc and the openings CEo, CEoa, CEob, and CEoc may substantially overlap. It may mean that sidewalls of the blocking patterns BP, BPa, BPb, and BPc defining the transmission portions BPo, BPoa, BPob, and BPoc and sidewalls of the common electrodes CE, CEa, CEb, and CEc defining the openings CEo, CEoa, CEob, and CEoc respectively overlap each other within a process error range.

Figure 11A:
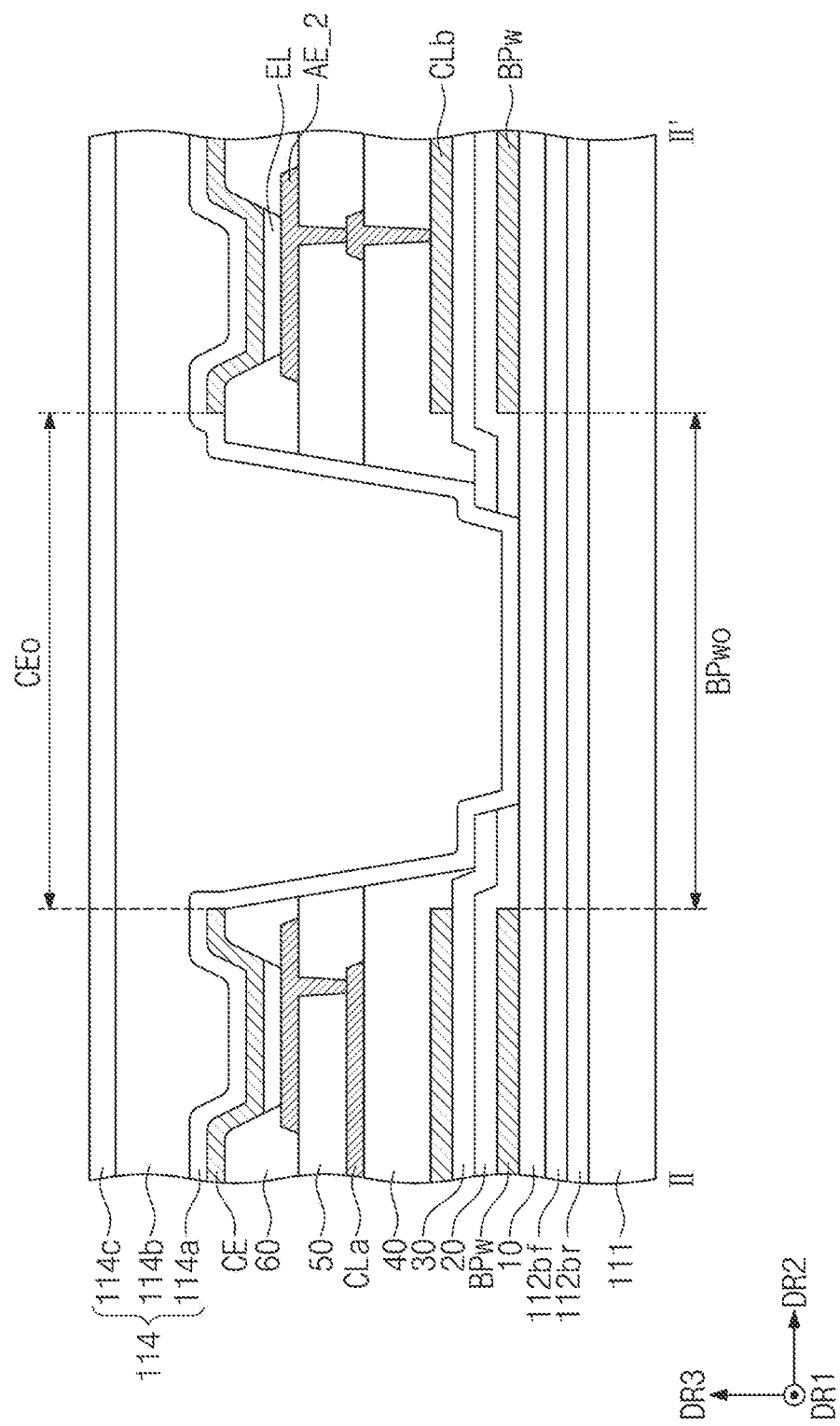
FIG. 11A is a cross-sectional view of a display layer according to some embodiments of the inventive concept.

FIG. 11A is a cross-sectional view of a display layer according to some embodiments of the inventive concept. FIG. 11A may be a cross-sectional view of a display layer of a portion corresponding to the line II-II' of FIG. 10A. In describing FIG. 11A, components which are the same as those described with reference to FIG. 8 and FIG. 9 are denoted by the same reference numerals, and descriptions thereof are omitted.

When compared with FIG. 8 and FIG. 9, the embodiments illustrated with respect to FIG. 11A are different in a blocking pattern BPw. In each of FIG. 8 and FIG. 9, the blocking pattern BP may include the first blocking pattern BP1 and the second blocking pattern BP2. The blocking pattern BPw illustrated in FIG. 11A may be composed of only the first blocking pattern BP1. For example, the blocking pattern BPw may be located between the first insulation layer 10 and the second insulation layer 20. For example, the blocking pattern BPw is located on the same layer as that of the gate GT, and may include the same material as that of the gate GT.

The blocking pattern BPw may be a pattern serving as a mask in a process of removing a portion of the common electrode CE. Portions of the common electrode CE overlapping the transmission portions BPwo of the blocking pattern BPw may be removed. In the portions of the common electrode CE overlapping the transmission portions BPwo, a plurality of the openings CEo may be defined.

Figure 11B:
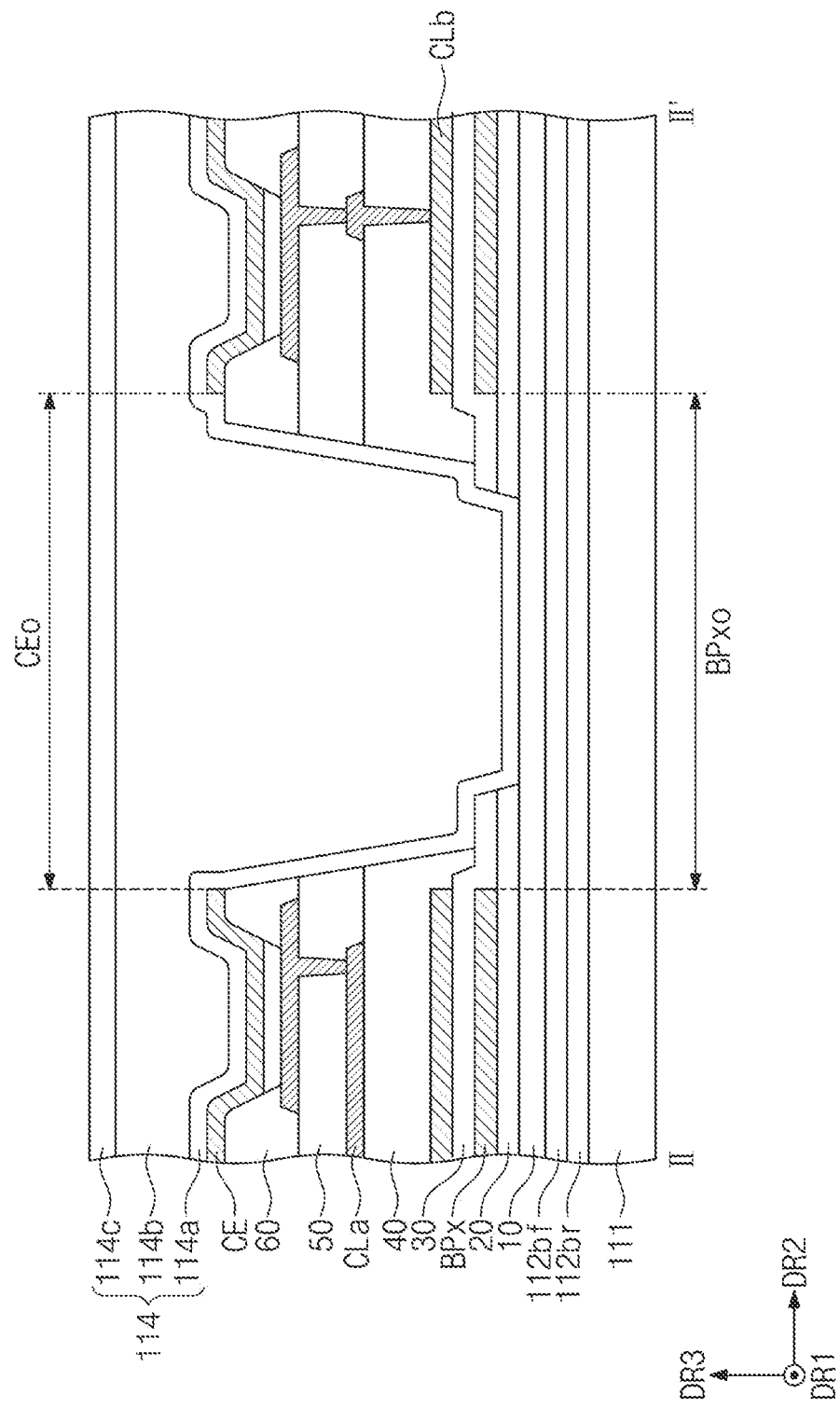
FIG. 11B is a cross-sectional view of a display layer according to some embodiments of the inventive concept.

FIG. 11B is a cross-sectional view of a display layer according to some embodiments of the inventive concept. FIG. 11B may be a cross-sectional view of a display layer of a portion corresponding to the line II-II' of FIG. 10A. In describing FIG. 11B, components which are the same as those described with reference to FIG. 8 and FIG. 9 are denoted by the same reference numerals, and descriptions thereof are omitted.

When compared with FIG. 8 and FIG. 9, the embodiments illustrated in FIG. 11B are different in a blocking pattern BPx. In each of FIG. 8 and FIG. 9, the blocking pattern BP may include the first blocking pattern BP1 and the second blocking pattern BP2. The blocking pattern BPx illustrated in FIG. 11B may be composed of only the second blocking pattern BP2. For example, the blocking pattern BPx may be located between the second insulation layer 20 and the third insulation layer 30. For example, the blocking pattern BPx is located on the same layer as that of the second electrode E2 (see FIG. 6) of the capacitor CP (see FIG. 6), and may include the same material as that of the second electrode E2 (see FIG. 6).

The blocking pattern BPx may be a pattern serving as a mask in a process of removing a portion of the common electrode CE. Portions of the common electrode CE overlapping the transmission portions BPxo of the blocking pattern BPx may be removed. In the portions of the common electrode CE overlapping the transmission portions BPxo, a plurality of the openings CEo may be defined.

Figure 11C:
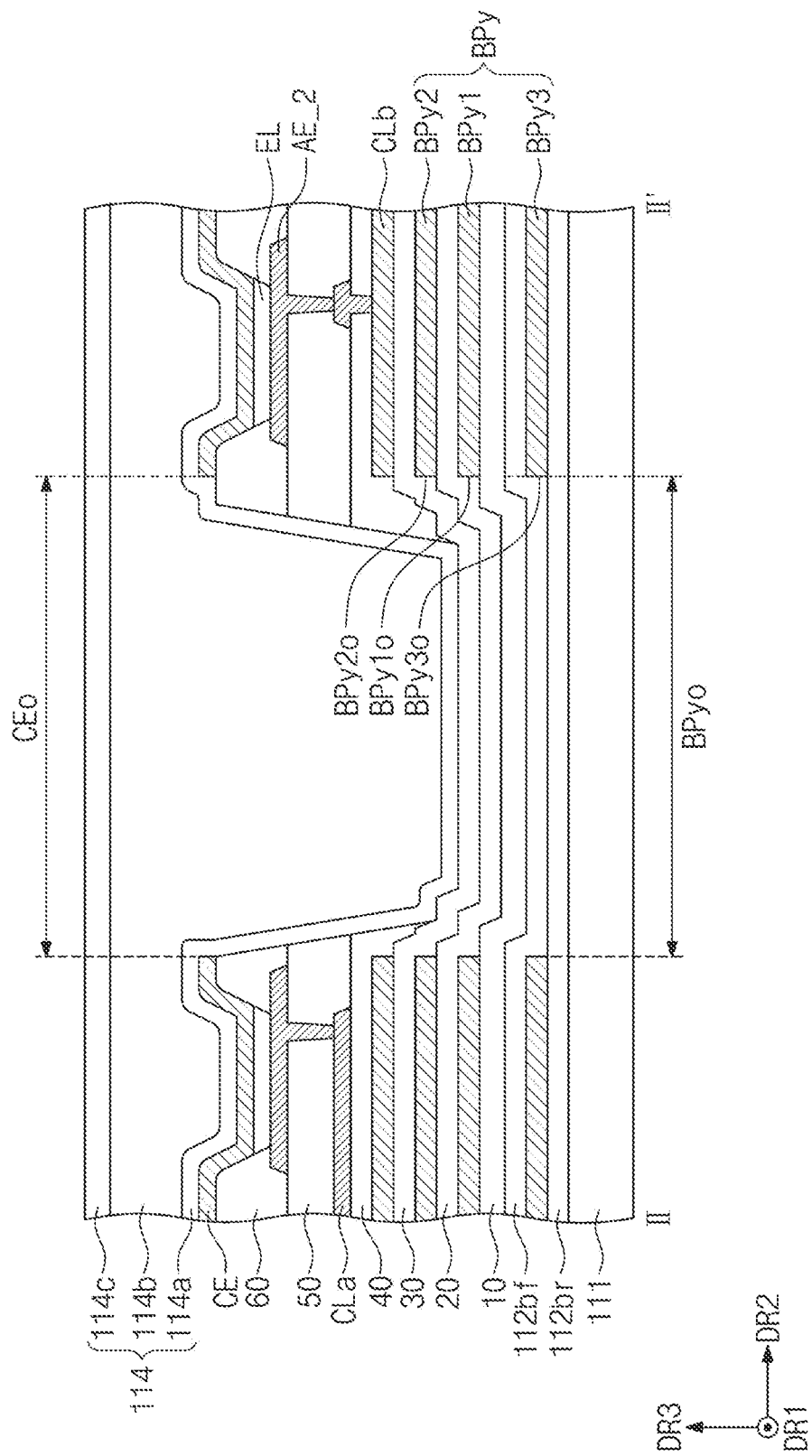
FIG. 11C is a cross-sectional view of a display layer according to some embodiments of the inventive concept.

FIG. 11C is a cross-sectional view of a display layer according to some embodiments of the inventive concept. FIG. 11C may be a cross-sectional view of a display layer of a portion corresponding to the line II-II' of FIG. 10A. In describing FIG. 11C, components which are the same as those described with reference to FIG. 8 and FIG. 9 are denoted by the same reference numerals, and descriptions thereof are omitted.

When compared with FIG. 8 and FIG. 9, the embodiments illustrated in FIG. 11C are different in a blocking pattern BPy. The blocking pattern BPy may include a first blocking pattern BPy1, a second blocking pattern BPy2, and a third blocking pattern BPy3. The first blocking pattern BP1 and the second blocking pattern BP2 respectively illustrated in FIG. 8 and FIG. 9 may respectively correspond to the first blocking pattern BPy1 and the second blocking pattern BPy2 illustrated in FIG. 11C.

The third blocking pattern BPy3 may be located below the first blocking pattern BPy1. For example, the third blocking pattern BPy3 may be located between the barrier layer 112*br* and the buffer layer 112*bf*.

The first blocking pattern BPy1, the second blocking pattern BPy2, and the third blocking pattern BPy3 may overlap each other. In the first blocking pattern BPy1, a first transmission portion BPy1*o* is defined, and in the second blocking pattern BPy2, a second transmission portion BP2*yo* may be arranged. In the third blocking pattern BPy3, a third transmission portion BP3*yo* may be arranged.

During a process of manufacturing the display panel 100 (see FIG. 2), a portion of the common electrode CE overlapping the first transmission portion BPy1*o*, the second transmission portion BPy2*o*, and the third blocking pattern BPy3*o* is removed, so that the opening CEo of the common electrode CE may be formed. Therefore, the first transmission portion BPy1*o*, the second transmission portion BPy2*o*, the third transmission portion Bpy3*o*, and the opening CEo of the common electrode CE may all overlap in the third direction DR3.

Figure 11D:
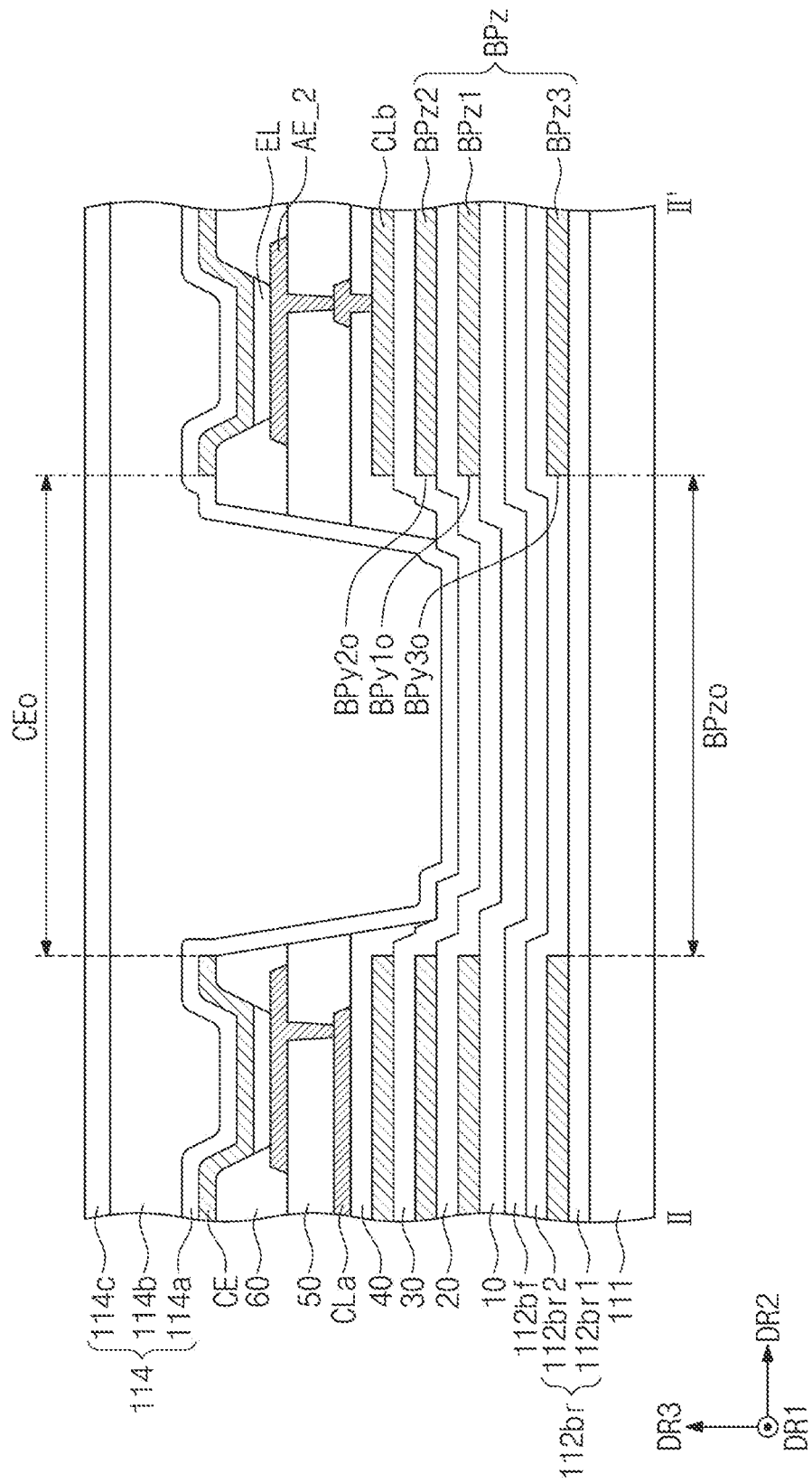
FIG. 11D is a cross-sectional view of a display layer according to some embodiments of the inventive concept.

FIG. 11D is a cross-sectional view of a display layer according to some embodiments of the inventive concept. FIG. 11D may be a cross-sectional view of a display layer of a portion corresponding to the line II-II' of FIG. 10A. In describing FIG. 11D, components which are the same as those described above are denoted by the same reference numerals, and descriptions thereof are omitted.

Referring to FIG. 11D, the barrier layer 112*br* may include a first sub-barrier layer 112*br*1 and a second sub-barrier layer 112*br*2. The first sub-barrier layer 112*br*1 may be located on the base layer 111, and the second sub-barrier layer 112*br*2 may be located on the first sub-barrier layer 112*br*1.

The blocking pattern BPz may include a first blocking pattern BPz1, a second blocking pattern BPz2, and a third blocking pattern Bpz3. The first blocking pattern BP1 and the second blocking pattern BP2 respectively illustrated in FIG. 8 and FIG. 9 may respectively correspond to the first blocking pattern BPz1 and the second blocking pattern BPz2 illustrated in FIG. 11D.

The third blocking pattern BPz3 may be located below the first blocking pattern BPz1. For example, the third blocking pattern BPz3 may be located between the first sub-barrier layer 112*br*1 and the second sub-barrier layer 112*br*2.

Figure 12:
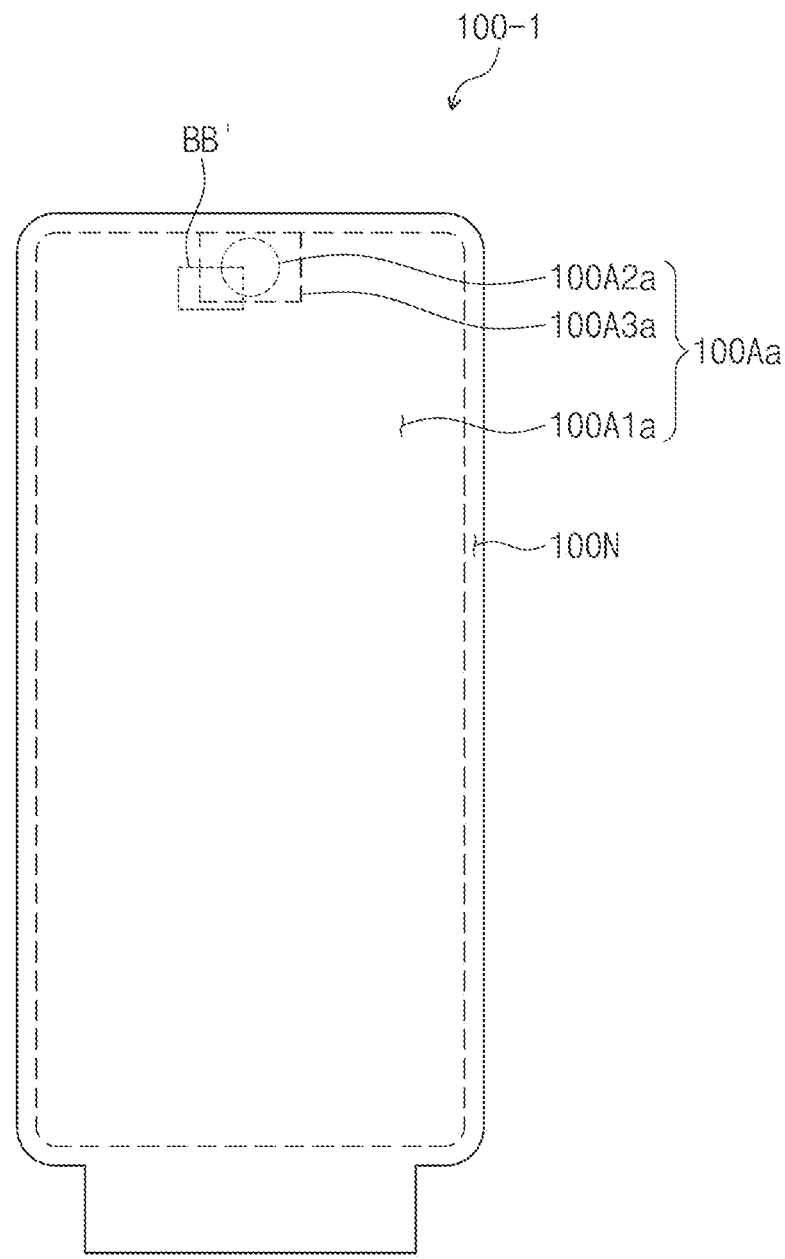
FIG. 12 is a plan view of a display panel according to some embodiments of the inventive concept.

FIG. 12 is a plan view of a display panel according to some embodiments of the inventive concept.

Referring to FIG. 12, in a display panel 100-1, a display region 100Aa and a peripheral region 100N may be defined. The display region 100Aa may correspond to the display region 1000A illustrated in FIG. 1.

The display region 100Aa may include a first display region 100A1*a*, a second display region 100A2*a*, and a third display region 100A3*a*. The third display region 100A3*a* may be located between the first display region 100A1*a* and the second display region 100A2*a*. The second display region 100A2*a* may be a region overlapping the electronic module 200 (see FIG. 2), and the third display region 100A3*a* may be a region adjacent to the second display region 100A2*a*.

Figure 13:
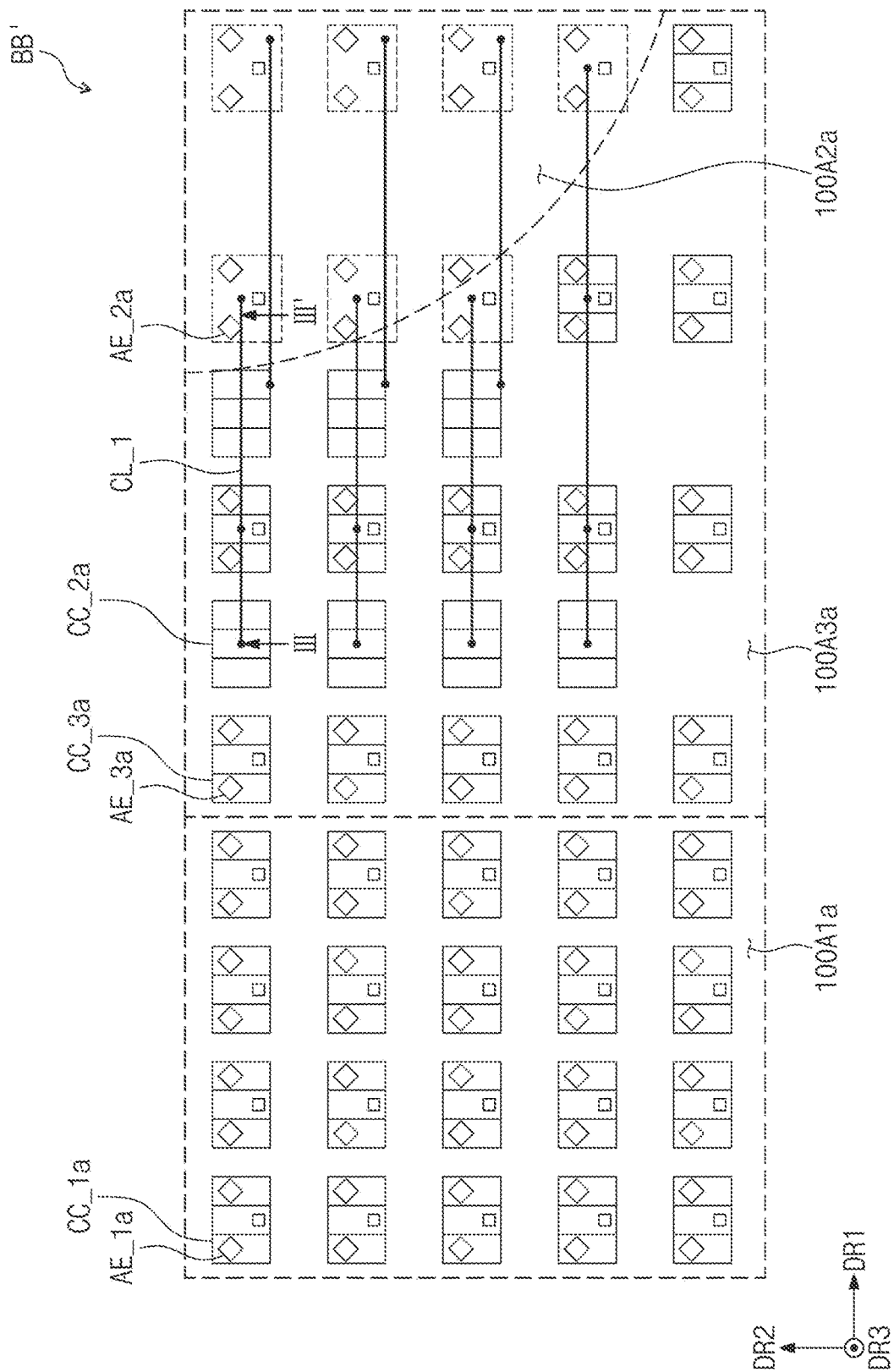
FIG. 13 is a plane view illustrating an enlarged view of the region BB' of FIG. 12.

FIG. 13 is a plane view illustrating an enlarged view of region BB' of FIG. 12.

Referring to FIG. 13, a plurality of first pixel electrodes AE_1*a* (hereinafter, first pixel electrodes), a plurality of second pixel electrodes AE_2*a* (hereinafter, second pixel electrodes), a plurality of first pixel electrodes AE_3*a* (hereinafter, third pixel electrodes), a plurality of first pixel circuits CC_1*a* (hereinafter, first pixel circuits), a plurality of second pixel circuits CC_2*a* (hereinafter, second pixel circuits), and a plurality of third pixel circuits CC_3*a* (hereinafter, third pixel circuits) are illustrated.

The first pixel electrodes AE_1*a* may be located in the first display region 100A1*a*, the second pixel electrodes AE_2*a* may be located in the second display region 100A2*a*, and the third pixel electrodes AE_3*a* may be located in the third display regions 100A3*a*. The resolution of the first display region 100A1*a* may be higher than the resolution of each of the second display region 100A2*a* and the third display region 100A3*a*. The density of the first pixel electrode AE_1*a* may be higher than the density of each of the second pixel electrode AE_2*a* and the third pixel electrode AE_1*a*.

Each of the first pixel circuits CC_1*a*, the second pixel circuits CC_2*a*, and the third pixel circuits CC_3*a* may have the same equivalent circuit as that of the pixel circuit CC (see FIG. 5) described with reference to FIG. 5. The first pixel circuits CC_1*a* may be electrically connected to the first pixel electrodes AE_1*a*, respectively, the second pixel circuits CC_2*a* may be electrically connected to the second pixel electrodes AE_2*a*, and the third pixel circuits CC_3*a* may be electrically connected to the third pixel electrodes AE_3*a*, respectively.

The first pixel circuits CC_1*a* may be located in the first display region 100A1*a*. The third pixel circuits CC_3*a* may be located in the third display region 100A3*a*. The second pixel circuits CC_2*a* may be spaced apart from the second pixel electrodes AE_2*a*. For example, the second pixel circuits CC_2*a* may be located in the third display region 100A3*a*. When viewed in the third direction DR3, the first pixel circuits CC_1*a* may respectively overlap the first pixel electrodes AE_1*a*, and the second pixel circuits CC_2*a* may not overlap the second pixel electrodes AE_2*a*. The third pixel circuits CC_3*a* may respectively overlap the third pixel electrodes AE_3*a*.

The display panel 100-1 may further include connection lines CL_1 for electrically connecting the second pixel electrodes AE_2*a* to the second pixel circuits CC_2*a*, respectively. Each of the connection lines CL_1 may include a transparent conductive material. Therefore, the deterioration in transmittance of the second display region 100A2*a* caused by the connection lines CL_1 may be reduced or minimized.

Figure 14:
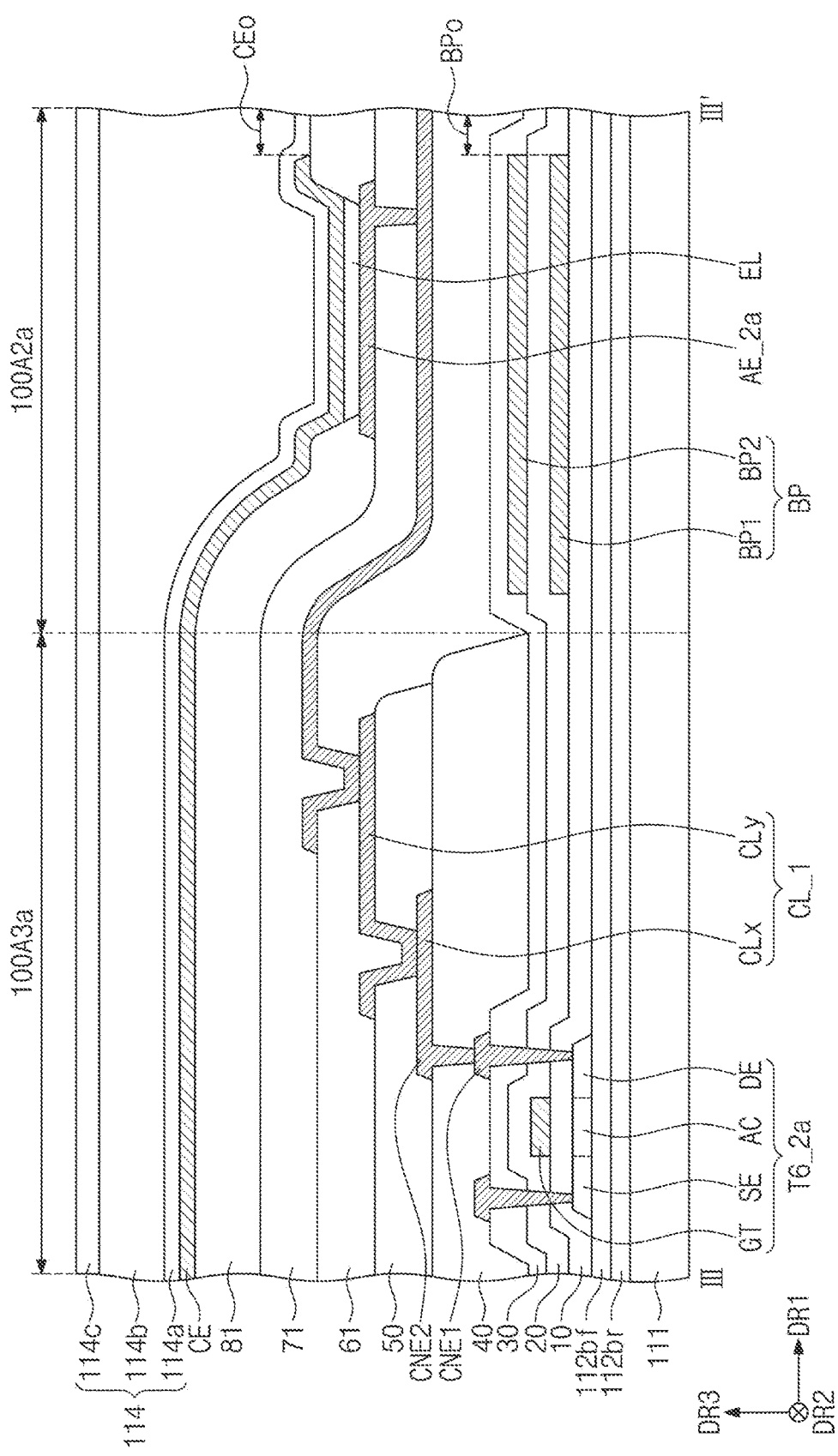
FIG. 14 is a cross-sectional view taken along the line III-III' illustrated in FIG. 13.

FIG. 14 is a cross-sectional view taken along the line III-III' illustrated in FIG. 13.

Referring FIG. 13 and FIG. 14, because a sixth transistor T6_2*a* is included in the second pixel circuits CC_2*a*, the sixth transistor T6_2*a* may be located in the third display region 100A3*a*. The second pixel electrode AE_2*a* may be electrically connected to the sixth transistor T6_2*a* through the connection line CL_1.

The connection line CL_1 may include a first connection portion CLx and a second connection portion CLy. Each of the first connection portion CLx and the second connection portion CLy may include a transparent conductive material.

The first connection portion CLx may be located on the fifth insulation layer 50. The first connection portion CLx may come into contact with the second connection electrode CNE2 through the fifth insulation layer 50.

A sixth insulation layer 61 is located on the fifth insulation layer 50, and may cover the first connection portion CLx. The sixth insulation layer 61 may also be located in the second display region 100A2a. The sixth insulation layer 61 may be an organic layer, and may have a single-layered structure or a multi-layered structure. However, the embodiments of the inventive concept are not limited thereto.

The second connection portion CLy may be located on the sixth insulation layer 61. The second connection portion CLy may come into contact with the first connection portion CLx through the sixth insulation layer 61.

A seventh insulation layer 71 is located on the sixth insulation layer 61, and may cover the second connection portion CLy. The seventh insulation layer 71 may also be located in the second display region 100A2a. The seventh insulation layer 71 may be an organic layer, and may have a single-layered structure or a multi-layered structure. However, the embodiments of the inventive concept are not limited thereto.

The second pixel electrode AE_2a may be located on the seventh insulation layer 71. The second pixel electrode AE_2a may come into contact with the second connection portion CLy through the seventh insulation layer 71.

A pixel definition film 81 is located on the seventh insulation layer 71, and may cover a portion of the second pixel electrode AE_2a. On the pixel definition film 81, an opening is defined. The opening of the pixel definition film 81 exposes at least a portion of the second pixel electrode AE_2a.

The light emitting layer EL may be located on the second pixel electrode AE_2a. The common electrode CE may be located on the light emitting layer EL. The common electrode CE has an integral shape, and may be commonly located in the plurality of pixels. On the common electrode CE, the opening CEo may be defined. The opening CEo of the common electrode CE may overlap the transmission portion BPo of the blocking pattern BP.

Figure 15A:
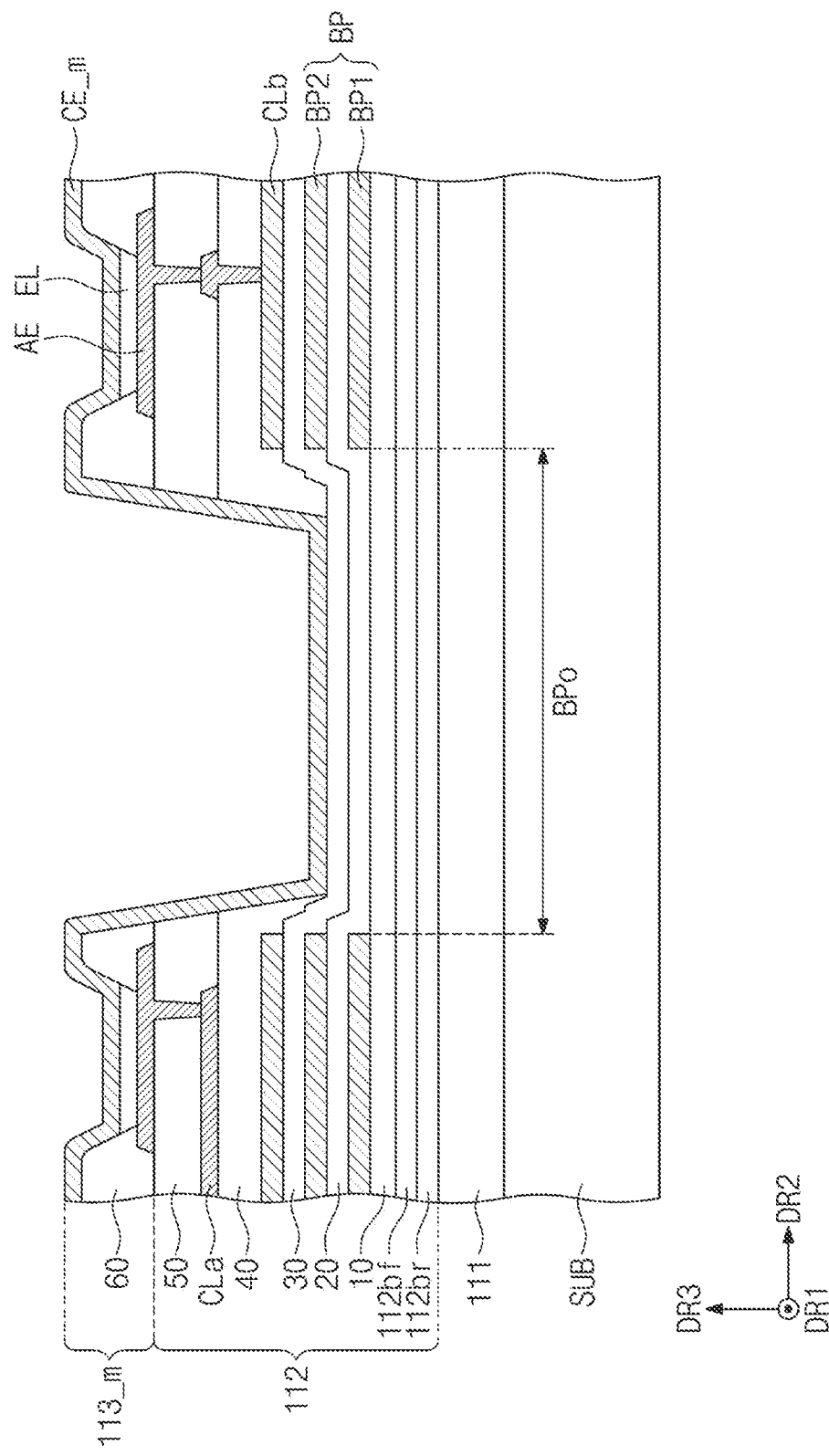
FIG. 15A, FIG. 15B, and FIG. 15C are views for describing a method for manufacturing an electronic device according to some embodiments of the inventive concept.
Figure 15B:
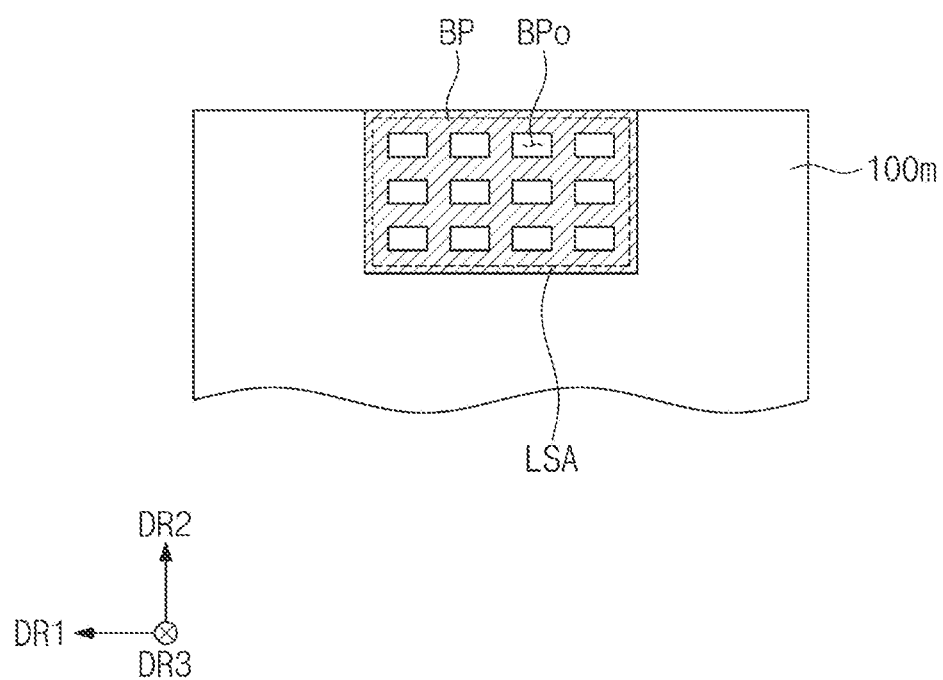
Figure 15C:
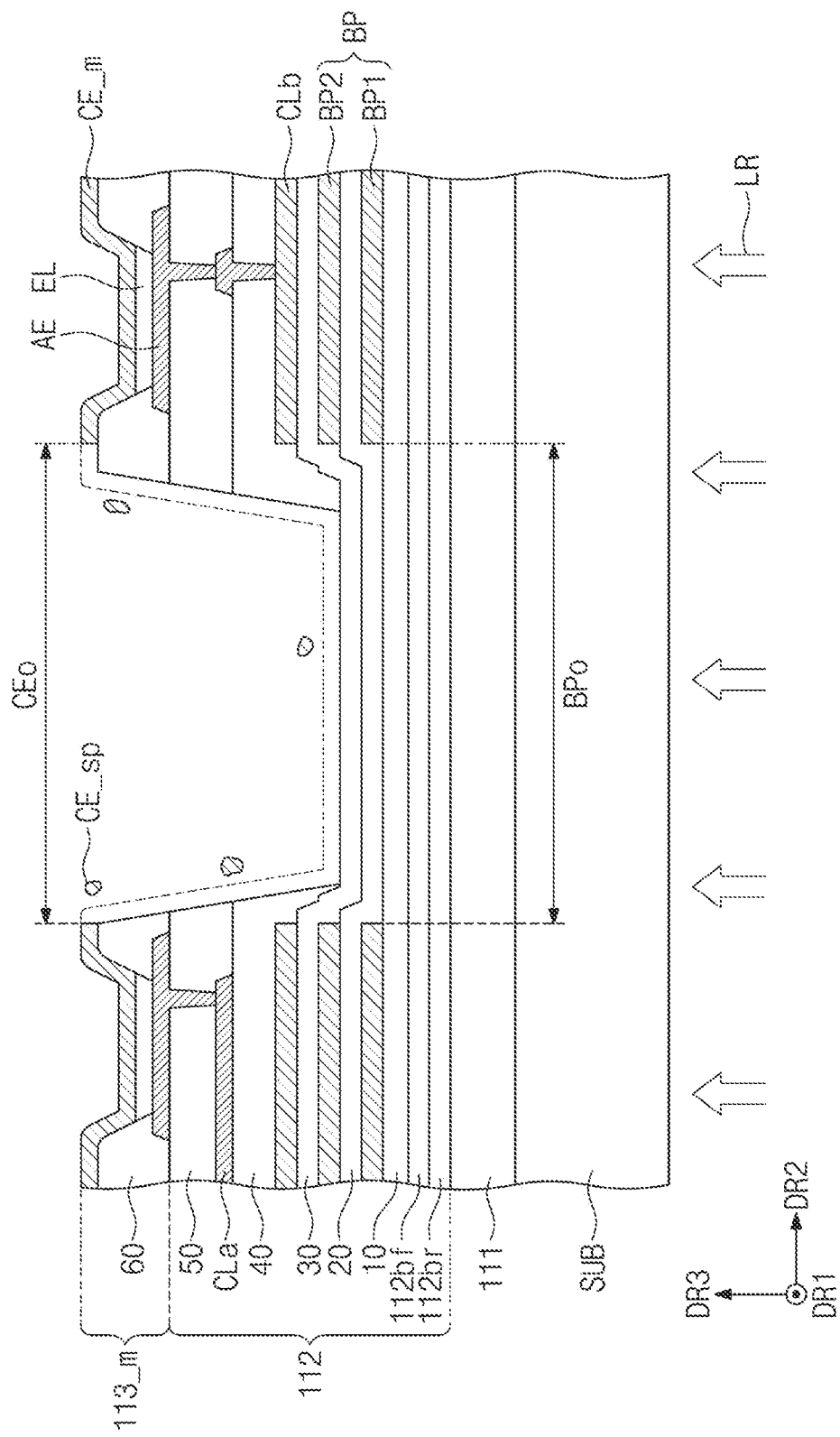

FIG. 15A, FIG. 15B, and FIG. 15C are views for describing a method for manufacturing an electronic device according to some embodiments of the inventive concept.

Referring to FIG. 15A, the base layer 111 is formed on a substrate SUB. Thereafter, the circuit layer 112 is formed on the base layer 111. A step of forming the circuit layer 112 may include a step of forming the transistors T1, T2, T3, T4, T5, T6, and T7 (see FIG. 5), a step of forming the capacitor CP (see FIG. 5), and a step of forming the blocking pattern BP having the transmission portion BPo. The blocking pattern BP may be located on the base layer 111.

A step of forming the blocking pattern BP may include a step of forming the first blocking pattern BP1 and a step of forming the second blocking pattern BP2. The first blocking pattern BP1 may be formed in the same process as that of the gate GT (see FIG. 6), and the second blocking pattern BP2 may be formed in the same process as that of the second electrode E2 (see FIG. 6).

Thereafter, a light emitting element layer 113_m is formed on the circuit layer 112. The light emitting element layer 113_m may include pixel electrodes AE, light emitting layers EL respectively located on the pixel electrodes AE, and a common electrode CE_m located in succession on the light emitting layers EL.

The common electrode CE_m may be formed over the entire display region 100A (see FIG. 2), and the common electrode CE_m may be formed in a region overlapping the transmission portion BPo of the blocking pattern BP.

Referring to FIG. 15B, an example of a rear surface of a display panel 100m during a manufacturing process is illustrated. The blocking pattern BP may overlap the second display region 100A2 and provided.

According to some embodiments of the inventive concept, a laser irradiation region LSA may overlap the second display region 100A2 (see FIG. 4). That is, the second display region 100A2 (see FIG. 4) may all be scanned by a laser beam. The blocking pattern BP blocks a laser beam, so that it may be possible to prevent a portion of the common electrode CE_m overlapping the blocking pattern BP from being heated by the laser beam. The transmission portion BPo of the blocking pattern BP may transmit the laser beam. Therefore, some regions of the common electrode CE_m overlapping the transmission portion BPo may be heated by the laser beam.

When a portion of the common electrode CE_m is patterned by selectively irradiating a laser beam on a specific region in the second display region 100A2 (see FIG. 4), the laser beam may be irradiated on a region smaller than the specific region in consideration of a laser processing tolerance. Therefore, the area of an opening formed in the common electrode CE may be reduced. However, according to some embodiments of the inventive concept, because the blocking pattern BP blocks a laser beam, the laser beam may be irradiated on the entire laser irradiation region LSA without taking a laser processing tolerance into account. Therefore, the area of the opening CEo formed in the common electrode CE may become larger than that of a comparative example. As a result, when patterning is performed by irradiating a laser beam on the entire second display region 100A2 (see FIG. 4), the transmittance of the second display region 100A2 may be further improved.

Referring to FIG. 15C, a step of removing a portion of the common electrode CE_m overlapping the transmission portion BPo is illustrated. A laser beam LR is irradiated in a direction toward the common electrode CE_m from the base layer 111. The portion of the common electrode CE_m overlapping the transmission portion BPo may be heated by the laser beam LR. That is, a portion of the common electrode CE may be heated and melted. Thereafter, the portion of the common electrode CE may be cooled. When the portion of the common electrode CE_m which has been heated is cooled, a portion CE_sp of the common electrode CE may be removed.

According to the above description, a common electrode may have a plurality of openings defined therein. Therefore, the transmittance of some regions of a display panel overlapping an electronic module may be improved. In addition, a laser beam used in a process of forming the plurality of openings in the common electrode may be partially blocked by a blocking pattern in which a plurality of transmission portions are defined, and may be partially transmitted. When forming the plurality of openings in the common electrode, the laser beam may be irradiated on the entire laser irradiation region without taking a laser processing tolerance into account. Therefore, the area of the openings formed in the common electrode according to some embodiments of the inventive concept may be larger than the area of openings formed in consideration of the shape of the openings and the laser processing tolerance. As a result, the transmittance of some regions of the display panel may be further improved.

Although aspects of the inventive concept have been described with reference to some example embodiments of the inventive concept, it will be understood by those skilled in the art that various modifications and changes in form and details may be made therein without departing from the spirit and scope of the inventive concept as set forth in the following claims. Accordingly, the technical scope of embodiments according to the inventive concept are not intended to be limited to the contents set forth in the detailed description of the specification, but is intended to be defined by the appended claims and their equivalents.

What is claimed is:

1. An electronic device comprising:
a display panel including a display region including a first display region and a second display region, the second display region having a higher transmittance than the first display region; and
an electronic module below the second display region of the display panel, wherein the display panel includes:
a base layer;
a plurality of first pixel electrodes on the base layer and in the first display region;
a plurality of second pixel electrodes on the base layer and in the second display region;
a common electrode on the plurality of first pixel electrodes and the plurality of second pixel electrodes and in which a plurality of openings are defined; and
a blocking pattern spaced apart from the common electrode with the plurality of second pixel electrodes interposed therebetween and in which a plurality of transmission portions overlapping the plurality of openings are defined, wherein both the plurality of second pixel electrodes and the plurality of openings overlap in the plan view, the electronic module.

2. The electronic device of claim 1, wherein the display panel further comprises:
a plurality of first pixel circuits electrically connected to the plurality of first pixel electrodes, respectively; and
a plurality of second pixel circuits electrically connected to the plurality of second pixel electrodes, respectively, wherein each of the plurality of first pixel circuits and the plurality of second pixel circuits includes a transistor including a gate, an active region, a source, and a drain, and a capacitor including a first electrode electrically connected to the transistor and a second electrode facing the first electrode.

3. The electronic device of claim 2, wherein the blocking pattern comprises a first blocking pattern and a second blocking pattern on the first blocking pattern, wherein:
the first blocking pattern is on a same layer as that of the gate, and includes a same material as that of the gate, and
the second blocking pattern is on a same layer as that of the second electrode, and includes a same material as that of the second electrode.

4. The electronic device of claim 3, wherein the blocking pattern further comprises a third blocking pattern below the first blocking pattern.

5. The electronic device of claim 4, wherein the display panel further comprises a barrier layer on the base layer and a buffer layer on the barrier layer, wherein:
the barrier layer includes a first sub-barrier layer on the base layer and a second sub-barrier layer on the first sub-barrier layer, and
the third blocking pattern is between the barrier layer and the buffer layer, or is between the first sub-barrier layer and the second sub-barrier layer.

6. The electronic device of claim 4, wherein, in the first blocking pattern, the second blocking pattern, and the third blocking pattern, a plurality of first transmission portions, a plurality of second transmission portions, and a plurality of third transmission portions which overlap the plurality of openings of the common electrode are respectively defined.

7. The electronic device of claim 2, wherein the blocking pattern is on a same layer as that of either the gate or the second electrode and includes a same material as that of either the gate or the second electrode.

8. The electronic device of claim 2, wherein the display panel further comprises a peripheral region adjacent to the display region, and
wherein the plurality of first pixel circuits are in the first display region, and the plurality of second pixel circuits are in the peripheral region.

9. The electronic device of claim 2, wherein the display panel further comprises a plurality of connection lines electrically connecting the plurality of second pixel electrodes and the plurality of second pixel circuits, respectively, and each of the plurality of connection lines includes a transparent conductive material.

10. The electronic device of claim 2, wherein the display region further comprises a third display region between the first display region and the second display region, and the plurality of second pixel circuits are in the third display region.

11. The electronic device of claim 10, wherein the display panel further comprises a plurality of third pixel electrodes on the base layer and in the third display region and a plurality of third pixel circuits in the third display region and electrically connected to the plurality of third pixel electrodes, respectively, wherein a first number of first pixel electrodes in a first region among the plurality of first pixel electrodes is greater than each of a second number of second pixel electrodes in a second region having a same size as that of the first region among the plurality of second pixel electrodes and a third number of third pixel electrodes in a third region having the same size as that of the first region among the plurality of third pixel electrodes.

12. The electronic device of claim 1, wherein the plurality of openings and the plurality of transmission portions are in the second display region.

13. The electronic device of claim 1, wherein, in the plan view, the plurality of transmission portions and the plurality of openings are spaced apart from the plurality of second pixel electrodes.

14. An electronic device comprising:
a display panel having a display region is defined; and
an electronic module below the display region of the display panel, wherein the display panel includes:
a light emitting element having a pixel electrode in the display region, a light emitting layer on the pixel electrode, and a common electrode on the light emitting layer;
a blocking pattern below the light emitting element having a transmission portion in a region spaced apart from the pixel electrode in a plan view;
a pixel circuit spaced apart from the pixel electrode and electrically connected to the light emitting element; and
a connection line electrically connecting the pixel circuit and the pixel electrode and including a transparent conductive material, wherein, in the plan view, an opening through the common electrode is overlapping the transmission portion,
wherein both the light emitting element and the opening overlap in the plan view, with the electronic module.

15. The electronic device of claim 14, wherein the display panel further comprises a peripheral region adjacent to the display region, and wherein the pixel circuit is in the peripheral region.

16. The electronic device of claim 14, wherein the pixel circuit comprises a transistor including a gate, an active region, a source, and a drain, and a capacitor including a first electrode electrically connected to the transistor and a second electrode facing the first electrode, and the blocking pattern comprises a first blocking pattern and a second blocking pattern on the first blocking pattern, wherein the first blocking pattern is on a same layer as that of the gate, and includes a same material as that of the gate, and the second blocking pattern is on a same layer as that of the second electrode, and includes a same material as that of the second electrode.

* * * * *